United States Patent [19]

Arimoto et al.

[11] Patent Number: 5,060,230
[45] Date of Patent: Oct. 22, 1991

[54] ON CHIP SEMICONDUCTOR MEMORY ARBITRARY PATTERN, PARALLEL TEST APPARATUS AND METHOD

[75] Inventors: Kazutami Arimoto; Kazuyasu Fujishima; Yoshio Matsuda; Tsukasa Ooishi; Masaki Tsukude, all of Hyogo, Japan

[73] Assignee: Mitsubishi Denki Kabushiki Kaisha, Tokyo, Japan

[21] Appl. No.: 400,899

[22] Filed: Aug. 30, 1989

[30] Foreign Application Priority Data

Aug. 30, 1988 [JP] Japan .............................. 63-217109
May 31, 1989 [JP] Japan .............................. 1-137972

[51] Int. Cl.$^5$ .............................................. G06F 11/00
[52] U.S. Cl. ...................................... 371/21.2; 365/201
[58] Field of Search ............... 371/21.2, 21.3, 21.1, 371/24, 71; 365/201

[56] References Cited

U.S. PATENT DOCUMENTS

| | | | |
|---|---|---|---|
| 4,541,090 | 9/1985 | Shiragasawa | 365/201 X |
| 4,667,330 | 5/1987 | Kumagai | 371/71 |
| 4,715,034 | 12/1987 | Jacobson | 365/201 X |
| 4,733,394 | 3/1988 | Giebel | 365/201 X |
| 4,811,294 | 3/1989 | Kobayashi | 371/21.2 X |
| 4,841,525 | 6/1989 | Lieske | 371/21.3 |
| 4,860,260 | 8/1989 | Saito | 365/201 |
| 4,885,748 | 12/1989 | Hoffmann | 365/201 X |
| 4,916,700 | 4/1990 | Ito | 371/21.2 X |
| 4,962,500 | 10/1990 | Nakagawa | 371/24 |

FOREIGN PATENT DOCUMENTS

0264893 10/1987 European Pat. Off.

OTHER PUBLICATIONS

M. Kumanoyo et al. "A 90ns 1Mb DRAM with Multi-Bit Test Mode" Digest of Technical Papers, 1985, IEEE International Solid-State Circuits Conference (Feb. 15, 1985), pp. 240–241.
T. Ohsawa et al "A 60ns 4Mb CMOS DRAM with Built-in Self-Test" Digest of Technical Papers, 1987, IEEE International Solid-State Circuits Conference (Feb. 27, 1987), pp. 286–287.
IBM Technical Disclosure Bulletin, vol. 30, No. 8, (Jan. 1988).
J. Inoue, et al, "Parallel Testing Technology for VLSI Memories", ITC Proceedings (1987), pp. 1066–1071.
T. Mano, et al, "Circuit Technologies for 16Mb DRAMS", 1987 IEEE Intern'l Solid-State Cir. Conf., pp. 22–23, 323–324.
A. Shah, et al., "A 4Mb DRAM With Cross-Point Trench Transistor Cell", 1986 IEEE International Solid State Conf. (Feb. 21, 1986), pp. 268–269, 369.
K. Arimoto et al "A 69ns 3.3V 16Mb DRAM" Digest of Technical Papers 1989 IEEE International Solid-State Circuits Conference (Feb. 17, 1989), pp. 244–245.
T. Takeshima et al "A 55ns 16Mb DRAM" Digest of Technical Papers, 1989 IEEE International Solid-State Circuits Conference (Feb. 17, 1989) pp. 246–247.

Primary Examiner—Robert W. Beausoliel
Attorney, Agent, or Firm—Lowe, Price, LeBlanc and Becker

[57] ABSTRACT

An apparatus for parallel testing of a semiconductor memory with arbitrary data patterns and capable of being integrated on the memory chip. The semiconductor memory test device in a preferred embodiment is compatible with hierarchical data bus lines including an input/output line pair (I/O, $\overline{I/O}$), a plurality of sub-input/output line pairs (SIO1, $\overline{SIO1}$; SIO2, $\overline{SIO2}$) and a plurality of bit line pairs (BL1, $\overline{BL1}$; BL6, $\overline{BL6}$). A plurality of comparators (50) and a plurality of registers (60) are provided corresponding to a plurality of sub-input/output line pairs (SIO1, $\overline{SIO1}$; SIO2, $\overline{SIO2}$). The plurality of registers (50) which also functions as intermediated output amplifiers can hold random data applied through the input/output line pair (I/O, $\overline{I/O}$). The plurality of comparators (60) is provided to determine whether or not data read out onto a plurality of sub-input/output line pairs (SIO1, $\overline{SIO1}$; SIO2, $\overline{SIO2}$) from a row of memory cells (MC1, MC2) corresponding to a single word line (WL) match respective data held in the plurality of registers (60).

18 Claims, 20 Drawing Sheets (HIERARCHICAL DATA BUS LINES)

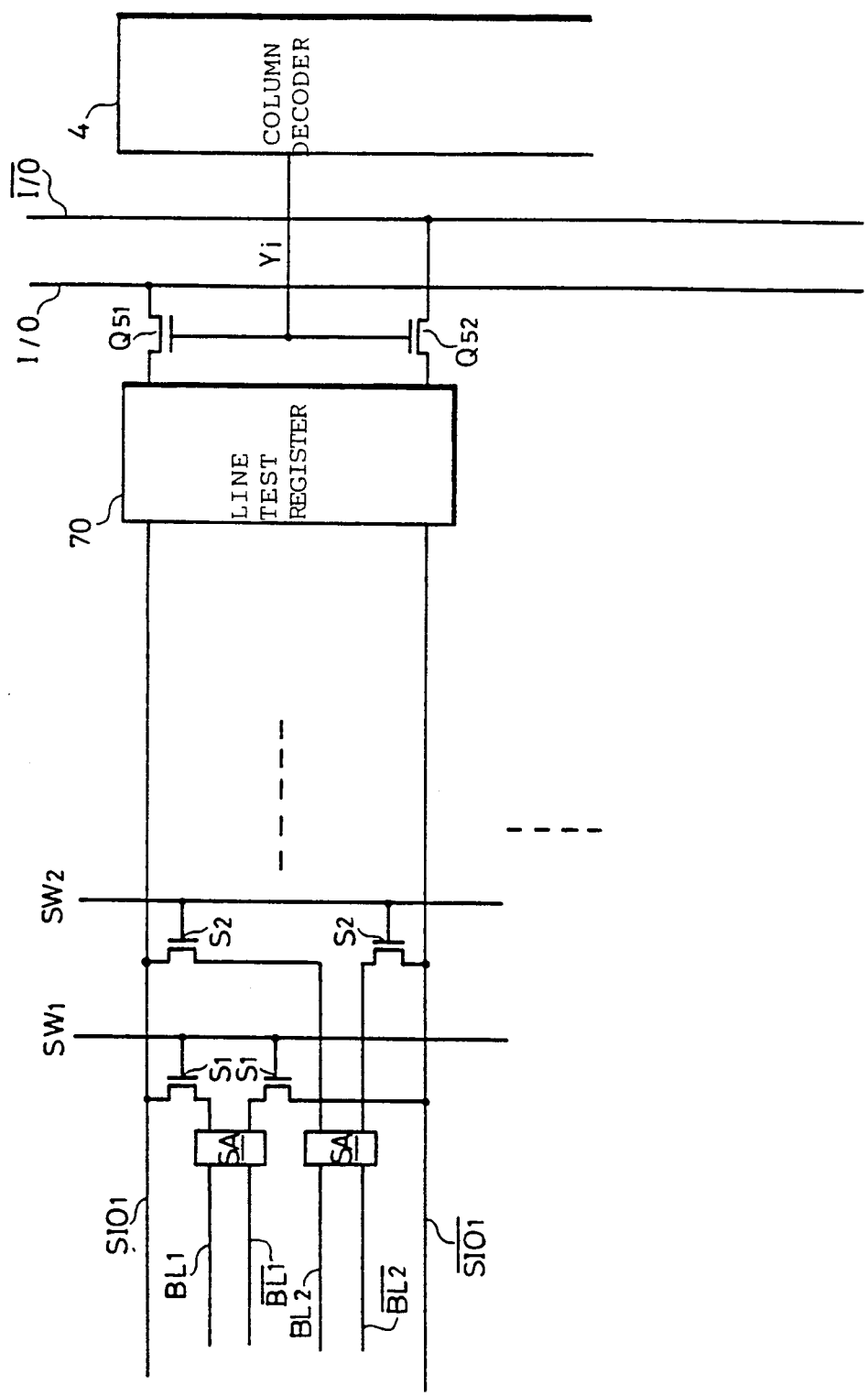

(WRITE OPERATION)

(WRITING EXPECTED DATA INTO REGISTERS)

(MATCH OPERATION)

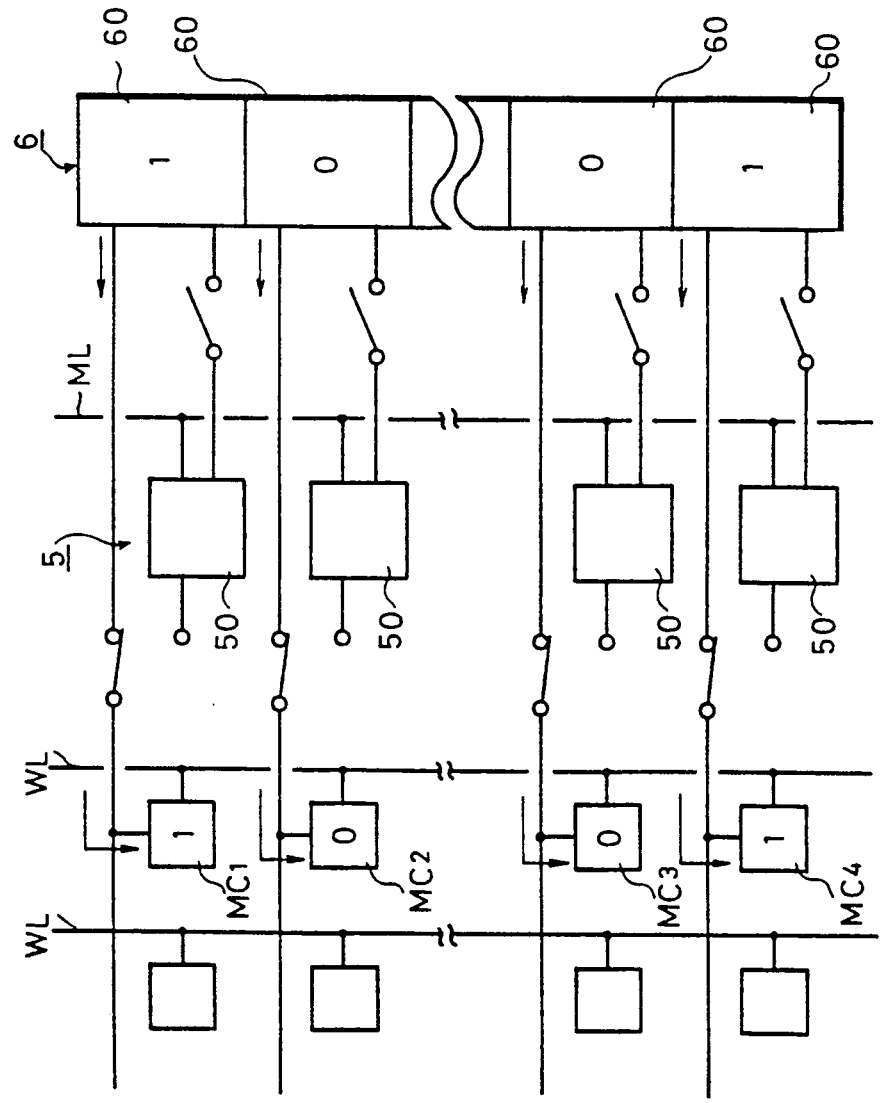

ON CHIP SEMICONDUCTOR MEMORY ARBITRARY PATTERN, PARALLEL TEST APPARATUS AND METHOD

BACKGROUND OF THE INVENTION

1. Field of the Invention

The present invention relates generally to semiconductor memory devices and a testing method therein, and more particularly, to a semiconductor memory device comprising an on-chip test circuit and a testing method therein.

2. Description of the Background Art

As the capacity of a semiconductor memory device is increased, the increase in test time becomes a serious problem. In an article by J. Inoue et al., entitled "PARALLEL TESTING TECHNOLOGY FOR VLSI MEMORIES", ITC Proceedings.,1987, pp. 1066–1071; an article entitled "TECHNOLOGY FOR INCREASING TEST EFFICIENCY SUITABLE FOR VERY LARGE CAPACITY MEMORIES", 1987 National Conference 165 of Semiconductor Materials Section of Institute of Electronics, Information and Communication Engineers of Japan, pp. 166, a parallel testing technology for VLSI memories, which reduces functional test time drastically, is proposed. All memory cells connected to a word line are simultaneously tested by introducing an on-chip test circuit.

FIG. 1 is a circuit diagram showing a structure of a memory comprising an on-chip test circuit shown in the latter document. This memory comprises an m x n bit memory array having a plurality of memory cells arranged in a matrix, as shown in, for example, FIG. 2.

In FIG. 1, a test circuit 20 is connected to a memory array 10. In the memory array 10, a plurality of word lines and a plurality of bit line pairs are arranged intersecting with each other, memory cells being provided at intersections thereof. In FIG. 1, four word lines WLI to WL4 and two bit line pairs B1, $\overline{B1}$ and B2, $\overline{B2}$ are typically shown. The test circuit 20 comprises a write circuit 30, comparing circuits CP1 and CP2 and a detecting circuit 100. The write circuit 30 comprises N channel MOS transistors Q1 to Q4, a write control line WC, and write lines W and $\overline{W}$. The comparing circuit CP1 comprises N channel MOS transistors Q5 and Q6, and the comparing circuit CP2 comprises N channel MOS transistors Q7 and Q8. The detecting circuit 100 comprises N channel MOS transistors Q9 and Q10, an inverter G1, and a precharge circuit 110.

In the above described document, a line test is proposed by which test time is significantly reduced. Description is now made on the line test. First, for example, "H" and "L" level data are respectively applied to the write lines W and $\overline{W}$, and a potential on the write control line WC is raised to the "H" level. Consequently, the transistors Q1 to Q4 are turned on, so that potentials on the bit lines B1 and B2 become the "H" level and the potentials on the bit lines $\overline{B1}$ and $\overline{B2}$ become the "L" level. When a potential on the word line WL1 is raised to the "H" level, "H" level data are respectively written into memory cells M1 and M3. After writing, the potentials on the word line WL1 and the write control line WC are brought to the "L" level.

Thereafter, when the potential on the word line WL1 is raised to the "H" level, the data stored in the memory cells M1 and M3 are respectively read out onto the bit lines B1 and B2. Data on the bit line pairs B1, $\overline{B1}$ and B2, $\overline{B2}$ are amplified by a sense amplifier (not shown).

In the case of the memory array 10 shown in FIG. 2, n-bit: data as amplified are read out onto the bit line pairs. Then, "L" and "H" level data are respectively applied to the write lines W and $\overline{W}$.

When the data read out from the memory cells M1 and M3 are at the "H" level, the potentials on the bit lines& B1 and B2 become the "H" level, and the potentials on the bit lines $\overline{B1}$ and $\overline{B2}$ become the "L" level. Consequently, the transistors Q5 and Q7 are turned on, so that both potentials of nodes N1 and N2 become the "L" level. Therefore, the transistors Q9 and Q10 are turned off, so that the node N3 precharged in advance by the precharge circuit 110 is not discharged. Thus, an "L" level flag signal is outputted to a detection signal output line DS.

It is assumed here that the memory cell M1, for example, is defective. In this case, the data read out from the memory cells M1 and M3 respectively become the "L" and "H" levels, although "H" level data were written in the memory cells M1 and M3. Consequently, the potentials on the bit lines B1 and $\overline{B1}$ respectively become the "L" and "H" levels. When "L" and "H" level data are respectively applied to the write lines W and $\overline{W}$, the transistor Q6 is turned on, so that the node N1 is charged at the "H" level. Consequently, the transistor Q9 is turned on, so that the node N3 is discharged at the "L" level. As a result, an "H" level flag signal indicating an error is outputted from the detection signal output line DS.

As described in the foregoing, in the above described line test, data are applied to the write lines W and W and then, the data are written into a row of memory cells connected to a selected word line. As a result, the same data are written in the row of memory cells. The data are read out from the row of memory cells, and data opposite to the data previously applied to the write lines W and $\overline{W}$ are respectively applied to the write lines W and W. When data read out from a row of memory cells all match data previously written in the row of memory cells, an "L" level flag signal is outputted from the detection signal output line DS. On the other hand, when at least one memory cell out of a row of memory cells connected to one word line is defective so that data read out from the memory cell does not match data previously written in the memory cell, an "H" level flag signal is outputted from the detection signal output line DS.

As described in the foregoing, in the memory comprising an on-chip test circuit shown in FIG. 1, all memory cells connected to one word line are simultaneously tested. Thus, significant test time reduction is expected.

However, in this memory, the write control line WC and the write lines W and W common to all the bit line pairs are provided, whereby only the same data can be written in a row of memory cells connected to one word line. More specifically, a pattern of test data inputted to a row of memory cells is formed of "H" or "L" level data. Therefore, leakage between adjacent memory cells, or the like can not be detected by writing different data into the adjacent memory cells. Thus, in the memory shown in FIG. 1, detection sensitivity of the defective memory cell is decreased, although the test time can be reduced by the line test.

SUMMARY OF THE INVENTION

An object of the present invention is to improve the reliability of a test without increasing the test time, in a semiconductor memory device comprising an on-chip test circuit.

Another object of the present invention is to provide a semiconductor memory device comprising an on-chip test circuit capable of performing a line test based on random test data.

Still another object of the present invention is to provide a testing method in which the reliability can be improved without increasing the test time in a semiconductor memory device comprising an on-chip test circuit.

Still another object of the present invention is to reduce the test time and/or improve the reliability of a test without increasing the scale of an additional circuit, in a large capacity semiconductor memory device.

Still another object of the present invention is to provide a large capacity semiconductor memory device comprising an on-chip test circuit capable of performing a line test based on random or arbitrary test data and having another function.

A further object of the present invention is to make it possible to perform a line test based on random test data and to achieve a high-speed operation and low power consumption, in a large capacity semiconductor memory device having a group of data bus lines of a hierarchical structure.

A still further object of the present invention is to make it possible to perform a line test based on random test data in a large capacity semiconductor memory device having a redundant circuit.

In order to attain the above described objects, an on chip apparatus for testing a semiconductor structure using arbitrary test patterns having at least a pair of data line portions connected to a plurality of memory cells comprises means for controlling read/write operations of the plurality of memory cells. The on chip apparatus further comprises register means, comparator means and transfer gate means. The register means receives and holds respective bits of one arbitrary test pattern. The comparator means has one input connected to the register means. The transfer gate means connects the respective bits of at least one test pattern to a pair of connector lines identified with at least one pair of data lines during a write operation and thereafter isolates the pair of connectors from the register means and connects the pair of connectors to a further input of the comparator means during a read operation, whereby the comparator means provides a comparison of data written into and read from the memory cells.

In accordance with one aspect of the invention, the semiconductor memory device according to the present invention comprises a plurality of groups of bit lines, a plurality of word lines, a plurality of memory cells, a plurality of sub-input/output lines, an input/output line, a plurality of first switching means, a plurality of second switching means, a plurality of holding means, and a plurality of comparing means.

Each of the plurality of groups of bit lines comprises a plurality of bit lines. The plurality of word lines are arranged intersecting with the plurality of bit lines. The plurality of memory cells are respectively provided at intersections of the plurality of bit lines and the plurality of word lines. Each of the plurality of sub-input/output lines is provided corresponding to each of the plurality of groups of bit lines. There is provided the input/output line common to the plurality of sub-input/output lines. Each of the plurality of first switching means is connected between each of the plurality of bit lines and the corresponding sub-input/output line. Each of the plurality of second switching means is connected between each of the plurality of sub-input/output lines and the input/output line. Each of the plurality of holding means is provided corresponding to each of the plurality of sub-input/output lines and amplifies information on the corresponding sub-input/output line and holds the same. Each of the plurality of comparing means is provided corresponding to each of the plurality of sub-input/output lines and determines whether or not information held in the corresponding holding means matches information on the corresponding sub-input/output line.

In the semiconductor memory device according to the present invention, random data can be written and held in the plurality of holding means provided on the plurality of sub-input/output lines through the input/output line and the second switching means. The data held in the plurality of holding means can be simultaneously written into a row of memory cells connected to a selected word line through the plurality of first switching means. In addition, data stored in a row of memory cells connected to a selected word line can be simultaneously read out onto the plurality of sub-input/output lines through the plurality of first switching means. At the time of testing, the data read out onto the plurality of sub-input/output lines are compared with expected data held in the plurality of holding means.

According to the present invention, only the holding means and the comparing means are provided as additional circuits, so that a line test based on random test data can be performed. Thus, a reliable line test can be performed at reduced test time.

In accordance with another aspect of the present invention, the semiconductor memory device further comprises a plurality of third switching means. Each of the plurality of third switching means is connected between each of the plurality of holding means and the corresponding sub-input/output line.

Therefore, the plurality of holding means can be operated independent of operations for writing and reading data to and from memory cells. Thus, a plurality of holding means performs a multi-function.

In accordance with still another aspect of the present invention, the semiconductor memory device further comprises a redundant circuit and redundant circuit activating means. The redundant circuit activating means comprises a link element and is responsive to the presence or absence of disconnection of the link element for replacing with the redundant circuit any one of the plurality of sub-input/output lines and a group of bit lines, holding means and comparing means provided corresponding to the sub-input/output line. Thus, the yield of the semiconductor device can be improved by the redundant circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4B is a diagram showing another structure of a memory array of the semiconductor memory device shown in FIG. 3;

FIG. 11A is a typical diagram for explaining an operation for writing random data held in registers into a row of memory cells;

DESCRIPTION OF THE PREFERRED EMBODIMENTS

Referring now to the figures, the embodiments of the present invention will be described in detail.

Figure 1:
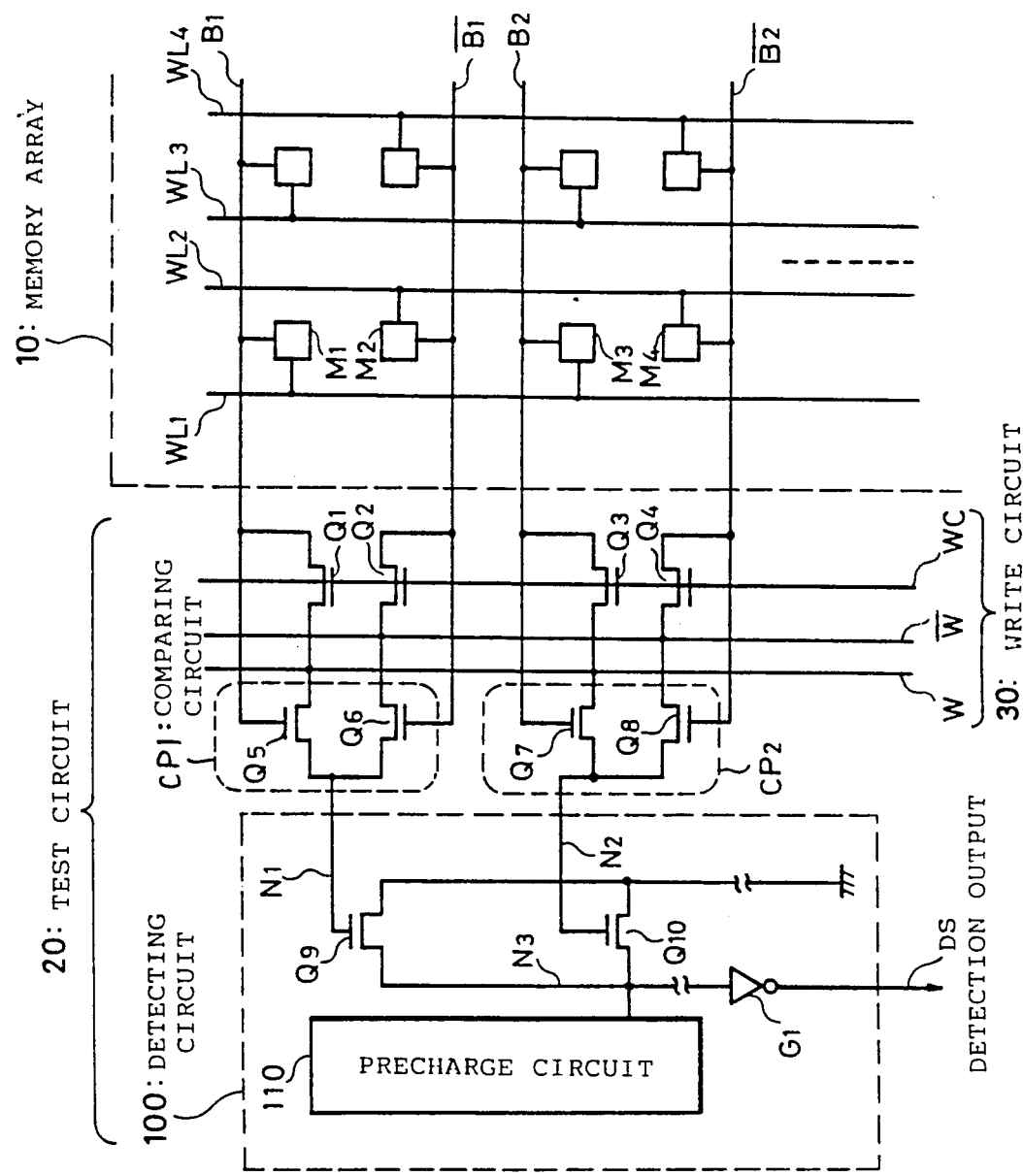
FIG. 1 is a circuit diagram showing a structure of a conventional semiconductor memory device comprising an on-chip test circuit.
Figure 2:
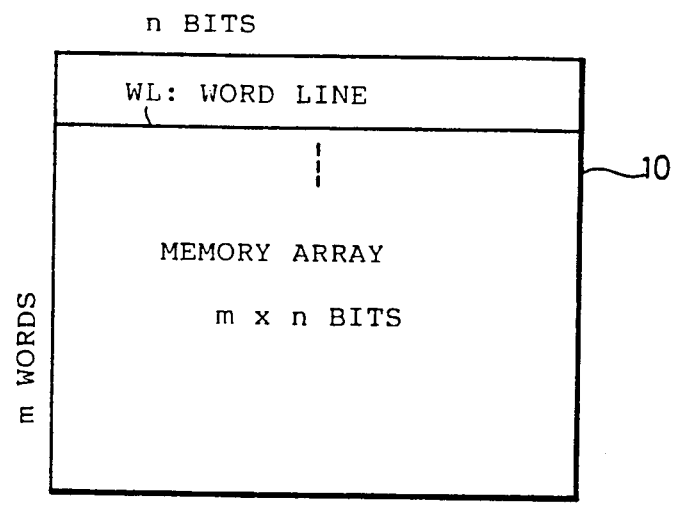
FIG. 2 is a diagram showing a memory array in the semiconductor memory device shown in FIG. 1.
Figure 3A:
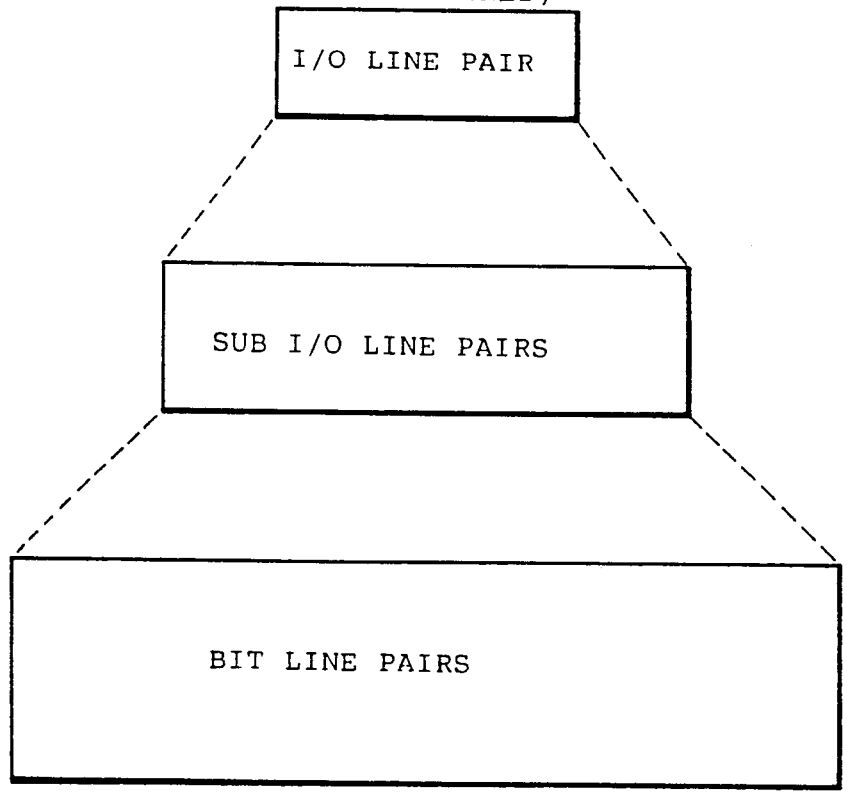
FIG. 3A is a diagram for explaining a hierarchical structure of data bus lines.
Figure 3:
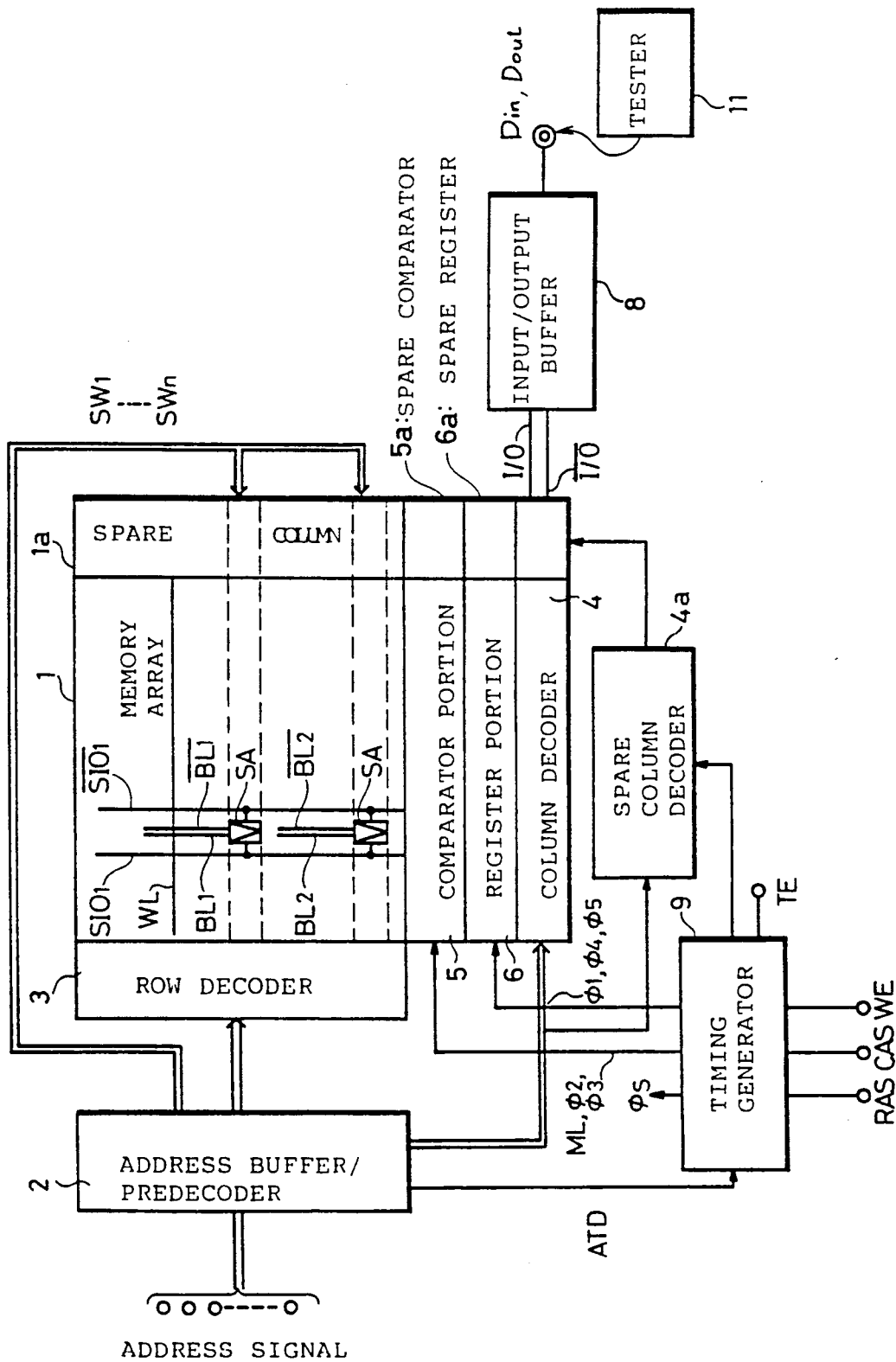
FIG. 3 is a block diagram showing an entire structure of a semiconductor memory device comprising an on-chip test circuit according to one embodiment of the present invention.

FIG. 3 is a block diagram showing an entire structure of a semiconductor memory device comprising an on-chip test circuit according to one embodiment of the present invention. In addition, FIG. 4A is a diagram showing a structure of a main portion of a memory array included in the semiconductor memory device shown in FIG. 3.

In FIG. 3, a memory array 1 comprises a plurality of sub-input/output line pairs arranged in a plurality of columns. A plurality of bit line pairs are provided corresponding to each of the plurality of sub-input/output line pairs. In FIG. 3, only one sub-input/output line pair (referred to as sub I/O line pair hereinafter) SIO1 and $\overline{SIO1}$ and two bit line pairs BL1, $\overline{BL1}$ and BL2, $\overline{BL2}$ provided corresponding thereto are typically shown.

Figure 4A:
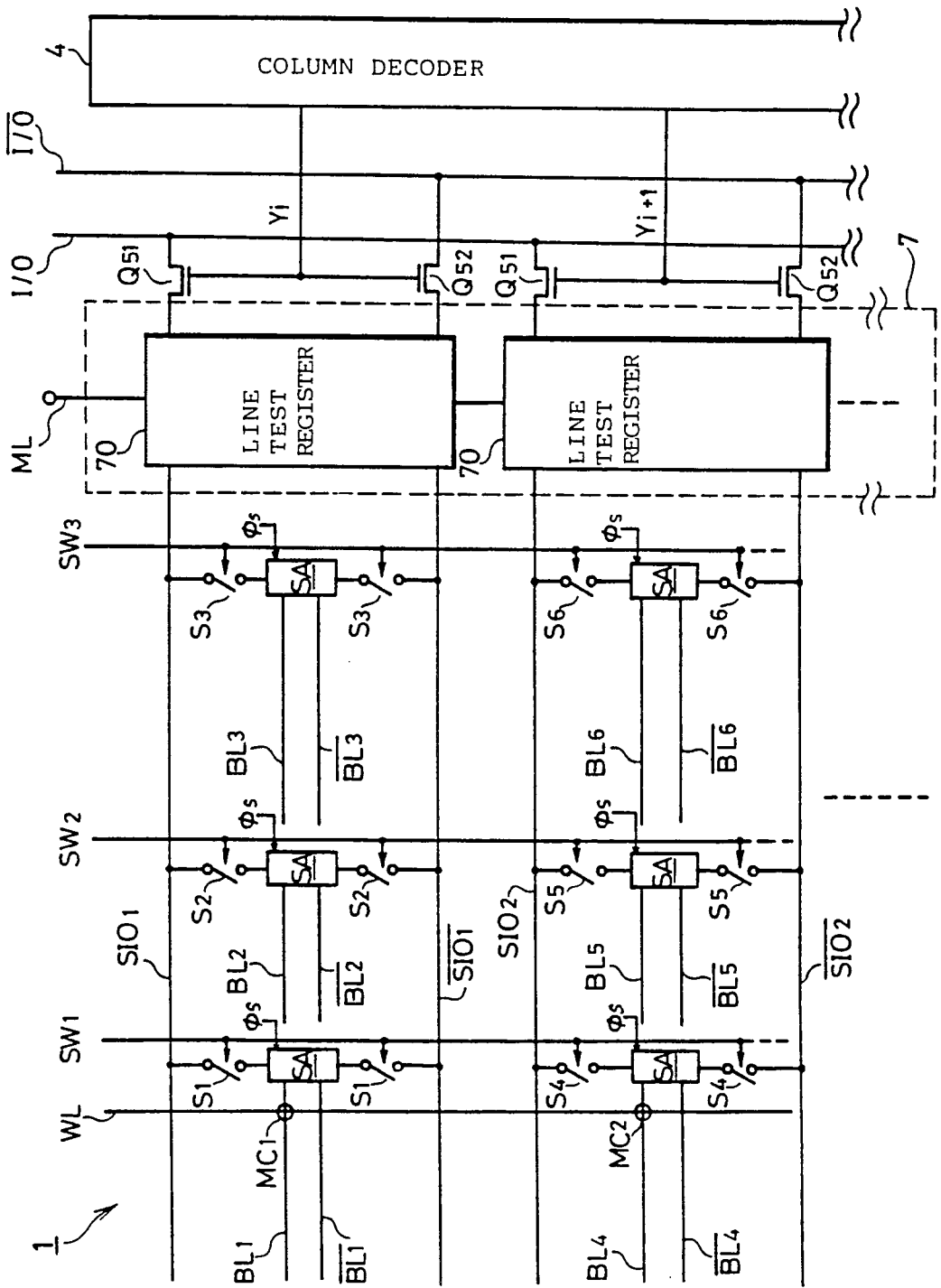
FIG. 4A is a diagram showing a structure of a main portion of a memory array in the semiconductor memory device shown in FIG. 3.

In FIG. 4A, only two sub I/O line pairs SIO1, $\overline{SIO1}$ SIO2, $\overline{SIO2}$ are typically shown. In addition, only three bit line pairs BL1, $\overline{BL1}$ to BL3, $\overline{BL3}$ provided corresponding to the sub I/O line pair SIO1 and $\overline{SIO1}$ are shown, and only three bit line pairs BL4, $\overline{BL4}$ to BL6, $\overline{BL6}$ provided corresponding to the sub I/O line pair SIO2 and $\overline{SIO2}$ are shown. A sense amplifier SA is connected to each of the bit line pairs BL1, $\overline{BL1}$ to BL6, $\overline{BL6}$. The sense amplifier SA is operated in response to a sense amplifier activating signal Φs.

Additionally, the bit lines BL1 and $\overline{BL1}$ are respectively connected to the sub I/O lines SIO1 and $\overline{SLO1}$ through switches S1. Similarly, the bit line pairs BL2, $\overline{BL2}$ and BL3, $\overline{BL3}$ are respectively connected to the sub I/O line pair SIO1 and $\overline{SIO1}$ through switches S2 and switches S3. In addition, the bit line pairs BL4, $\overline{BL4}$, BL5, $\overline{BL5}$ and BL6, $\overline{BL6}$ are respectively connected to the sub I/O line pair SIO2 and $\overline{SIO2}$ through switches S4, switches S5 and switches S6. A switching signal SW1 is applied to the switches S1 and S4, a switching signal SW2 is applied to the switches S2 and S5 and a switching signal SW3 is applied to the switches S3 and S6.

A plurality of word lines are arranged intersecting with the bit line pairs BL1, $\overline{BL1}$ to BL6, $\overline{BL6}$. In FIG. 4A, only a single word line WL intersecting with the bit line pairs BL1, $\overline{BL1}$ and BL4, $\overline{BL4}$ is typically shown. A memory cell MC1 is provided at an intersection of the word line WL and the bit line BL1, and a memory cell MC2 is provided at an intersection of the word line WL and the bit line BL4. On the other hand, the sub I/O line pairs SIO1, $\overline{SIO1}$ and SIO2, $\overline{SIO2}$ are respectively connected to an input/output line pair I/O and $\overline{I/O}$ through line test registers 70. The plurality of line test registers 70 constitute a line test register portion 7.

In this semiconductor memory device, data bus lines for inputting/outputting data to/from memory cells have a hierarchical structure comprising an input/output line pair, a plurality of sub I/O line pairs and a plurality of bit line pairs, as shown in FIG. 3A.

In FIG. 3, an address buffer/predecoder (merely referred to as address buffer hereinafter) 2 applies an externally applied address signal to a row decoder 3 at predetermined timings. In addition, the address buffer 2 applies the externally applied address signal to a column decoder 4 at predetermined timings. Furthermore, the address buffer 2 applies switching signals SW1 to SWn in response to the externally applied address signal. The row decoder 3 selects array one of word lines in the memory array 1 in response to the address signal. The column decoder 4 selects any one of sub I/O line pairs in the memory array 1 in response to the address signal, to connect the same to an input/output line pair I/O and $\overline{I/O}$ Data read out from the memory array 1 is outputted as output data Dout to the exterior through the input/output line pair I/O and $\overline{I/O}$ and an input/output buffer 8. In addition, externally applied input data Din is written into the memory array 1 through the input/output buffer 8 and the input/output line pair I/O and $\overline{I/O}$.

A comparator portion 5 and a register portion 6 are provided between the memory array 1 and the column decoder 4. The comparator portion 5 and the register portion 6 constitute a line test register portion 7 shown in FIG. 4A.

A timing generator 9 generates various control signals for controlling each portion upon receipt of a row address strobe signal RAS, a column address strobe signal CAS, a write enable signal WE, a test enable signal TE which are externally applied and an address transition detecting signal ATD applied from the address buffer 2. Meanwhile, a recent large capacity semiconductor memory device may comprise a redundant circuit including a spare column 1a, a spare comparator 5a, a spare register 6a, and a spare column decoder 4a in order to improve the yield.

FIG. 4B is a diagram showing another example of a structure of a memory array included in the semiconductor memory device shown in FIG. 3.

In FIG. 4B, only a single sub I/O line pair SIO1 and $\overline{SIO1}$ is typically illustrated. Two bit line pairs BL1 and $\overline{BL1}$ and BL2 and $\overline{BL2}$ are arranged adjacent to each other between the sub I/O lines SIO1 and $\overline{SIO1}$. Sense amplifiers SA connected to the bit line pairs BL1 and $\overline{BL1}$ and BL2 and $\overline{BL2}$ are arranged adjacent to each other. Each of switches S1 and S2 comprises an N channel MOS transistor. Structures of other portions are the same as those shown in FIG. 4A.

Figure 5:
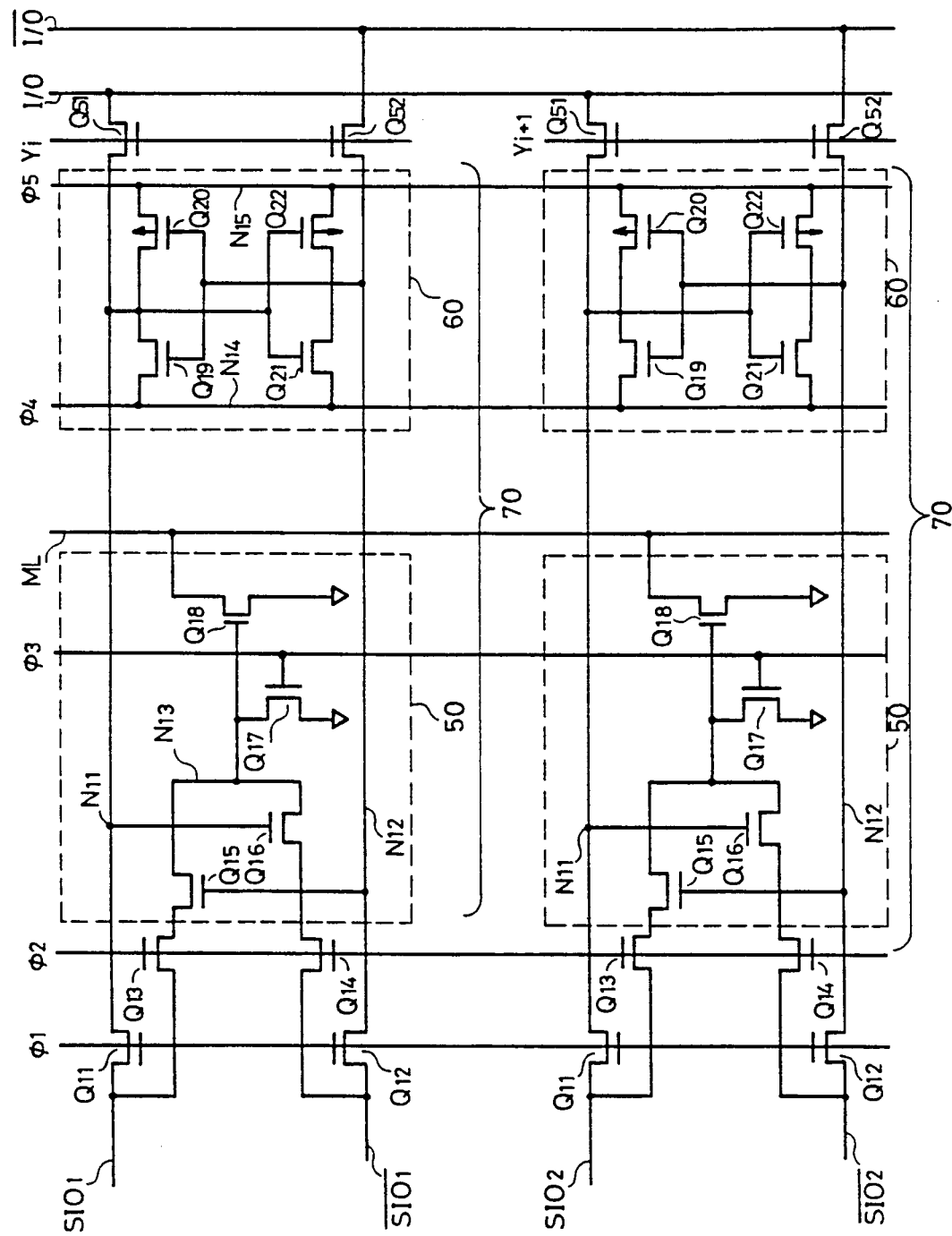
FIG. 5 is a circuit diagram showing a structure of a line test register shown in FIG. 4.

FIG. 5 is a circuit diagram showing a structure of the line test register portion 7 shown in FIG. 4A. In FIG. 5, each of line test registers 70 comprises a comparator 50 and a register 60. The comparator 50 comprises N channel MOS transistors Q15 to Q18. Nodes N11 and N12 in the comparator 50 are respectively connected to sub I/O lines SIO1 and $\overline{SIO1}$ through N channel MOS transistors Q11 and Q12. A node N13 in the comparator 50 is connected to the sub I/O line SIO1 through the transistor Q15 and an N channel MOS transistor Q13, and to the sub I/O line $\overline{SIO1}$ through the transistor Q16 and an N channel MOS transistor Q14. In addition, the transistor Q18 is coupled between a match line ML and a ground potential. The transistor Q18 has its gate connected to the node N13. Thus, the node N13 is connected to the match line ML in a wired-OR manner. The transistor Q17 is coupled between the node N13 and the ground potential. The transistors Q11 and Q12 have their gates receiving a control signal $\phi 1$, and the transistors Q13 and Q14 have their gates receiving a control signal $\phi 2$. Furthermore, the transistor Q17 has its gate receiving a control signal $\phi 3$. The transistors Q15 and Q16 constitute an exclusive OR circuit.

The register 60 comprises N channel MOS transistors Q19 and Q21 and P channel MOS transistors Q20 and Q22 respectively cross-coupled between the nodes N11 and N12. A control signal $\phi 4$ is applied to a node N14 in the register 60, and a control signal $\phi 5$ is applied to a node N15 therein.

On the other hand, the nodes N11 and N12 are respectively connected to input/output lines I/O and $\overline{I/O}$ through N channel MOS transistors Q51 and Q52. The transistors Q51 and Q52 have their gates receiving a column selecting signal $Y_i$ from the column decoder 4 shown in FIG. 3.

Structures of the comparator 50 and the register 60 connected to a sub I/O line pair SIO2 and $\overline{SIO2}$ are the same as those connected to the sub I/O line pair SIO1 and $\overline{SIO1}$. However, a column selecting signal $Y_{i+1}$ is applied from the column decoder 4 to gates of transistors Q51 and Q52 corresponding to the sub I/O line pair SIO2 and $\overline{SIO2}$. The control signals $\phi 1$ to $\phi 5$ are generated from the timing generator 9 shown in FIG. 3.

Referring now to timing charts of FIGS. 6 to 9, description is made on an operation of the semiconductor memory device shown in FIG. 3 to 5.

Figure 6:
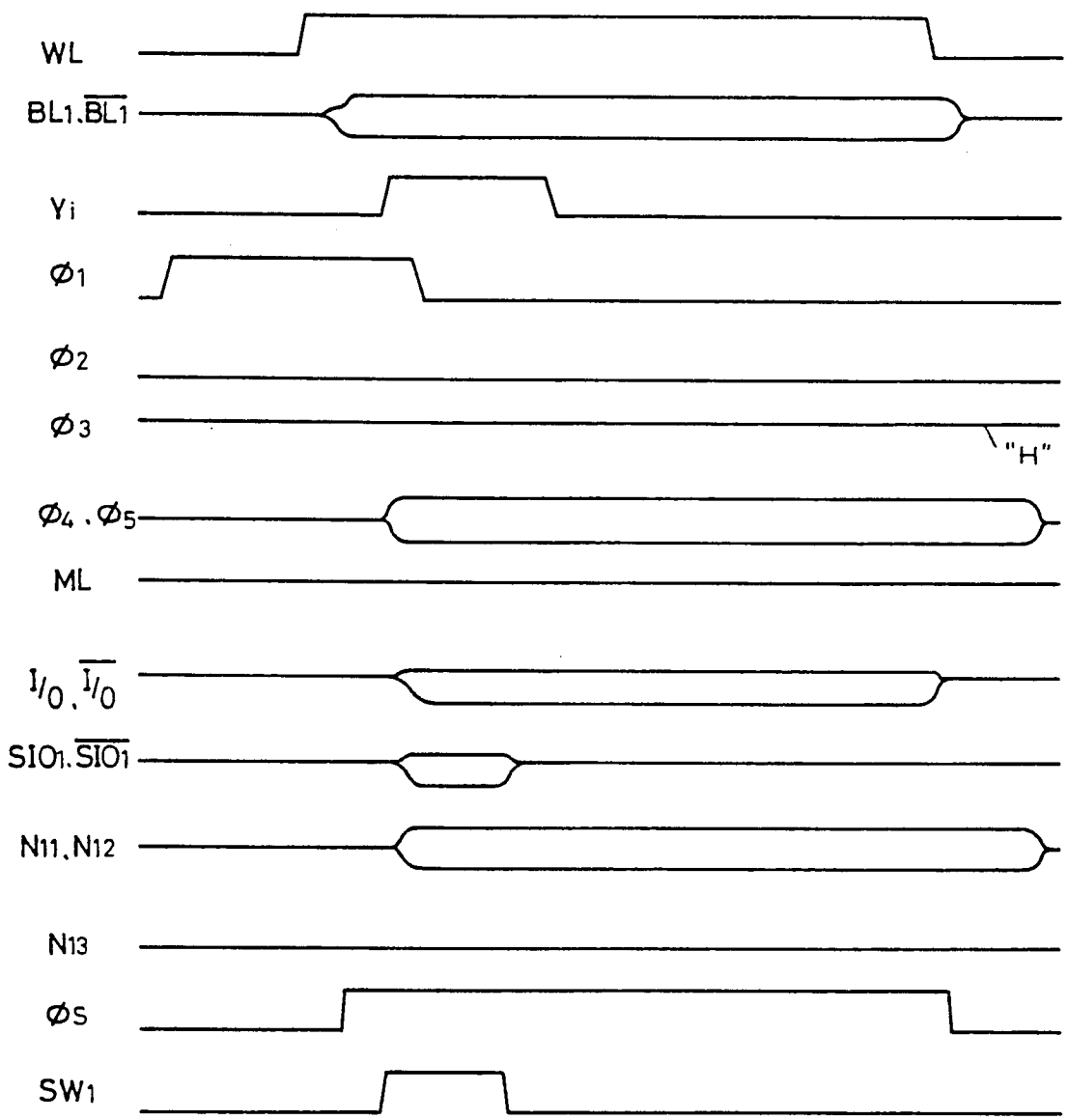
FIG. 6 is a timing chart for explaining an ordinary read operation in the semiconductor memory device shown in FIG. 3 to 5.

FIG. 6 is a timing chart for explaining an ordinary read operation in the semiconductor memory device.

When the control signal $\phi 1$ is raised to the "H" level, the transistors Q11 and Q12 are turned on. Consequently, each of the sub I/O line pairs SIO1, $\overline{SIO1}$ and SIO2, $\overline{SIO2}$ connected to the corresponding nodes N11 and N12. Then, when a potential on the word line WL is raised to the "H" level, data stored in the memory cell MC1 is read out onto the bit line BL1, and data stored in the memory cell MC2 is read out onto the bit line BL4 (in FIG. 4A). Consequently, potentials on the bit lines BL1 and BL4 are changed. When a sense amplifier activating signal $\phi s$ is raised to the "H" level, the sense amplifiers SA are operated. Consequently, potential differences between the bit line pair BL1 and $\overline{BL1}$ and between the bit line pair BL4 and $\overline{BL4}$ are respectively amplified. Then, when the switching signal SW1 is raised to the "H" level, the switches S1 and S4 are turned on, so that the bit line pairs BL1, $\overline{BL1}$ and BL4, $\overline{BL4}$ are respectively connected to the sub I/O line pairs SIO1, $\overline{SIO1}$ and SIO2, $\overline{SIO2}$. In addition, the column selecting signal $Y_i$ is raised to the "H" level, so that the sub I/O line pair SIO1 and $\overline{SIO1}$ is connected to the input/output line pair I/O and $\overline{I/O}$. Consequently, data on the bit line pair BL1 and $\overline{BL1}$ is transferred onto the input/output line pair I/O and $\overline{I/O}$ through the sub I/O line pair and the nodes N11 and N12. At that time, the control signals $\phi 4$ and $\phi 5$ are respectively changed to the "L" and "H" levels. As a result, a potential difference between the nodes N11 and N12 is amplified. In this case, each of the registers 60 serves as an amplifier.

In the above described manner, the data stored in the memory cell MC1 is read out onto the input/output line pair I/O and $\overline{I/O}$.

Figure 7:
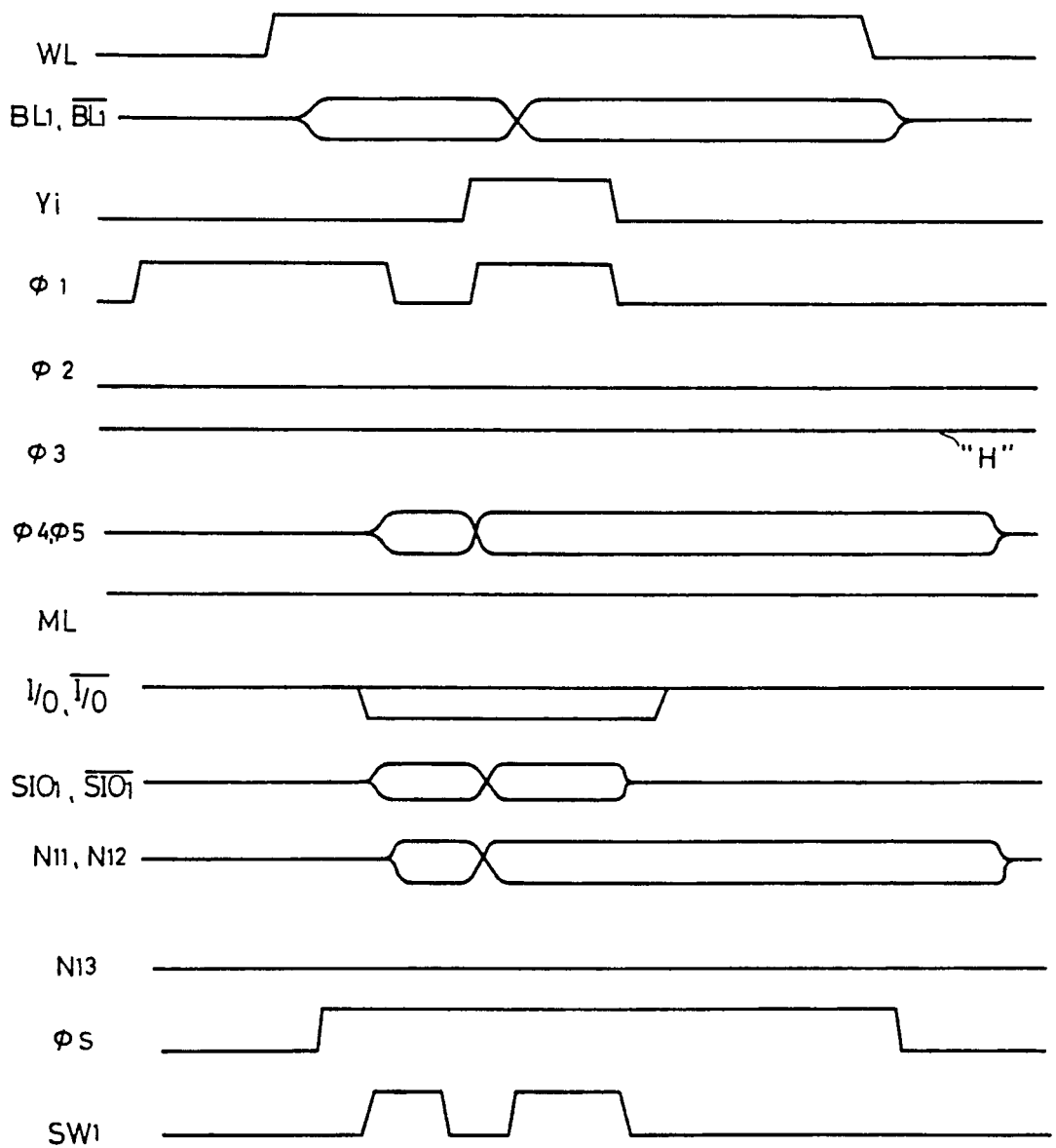
FIG. 7 is a timing chart for explaining an ordinary write operation in the semiconductor memory device shown in FIGS. 3 to 5.

FIG. 7 is a timing chart for explaining an ordinary write operation in this semiconductor memory device. It is assumed here that data is read out from the memory cell MC1 and then, inverted data of the data as read out is written into the memory cell MC1.

First, the control signal $\phi 1$ is raised to the "H" level. Consequently, each of the sub I/O line pairs SIO1, $\overline{SIO1}$ and SIO2, SIO2 is connected to the corresponding nodes N11 and N12. When a potential on the word line WL is raised to the "H" level, data stored in the memory cell MC1 is read out onto the bit line BL1, and data stored in the memory cell MC2 is read out onto the bit line BL4. When the sense amplifier activating signal as is raised to the "H" level, the sense amplifiers SA are operated. Consequently, potential differences between bit line pair BL1 and $\overline{BL1}$ between the bit line pair BL4 and $\overline{BL4}$ are respectively amplified.

Then, when the switching signal SW1 is raised to the "H" level, the bit line pair BL1 and $\overline{BL1}$ is connected to the sub I/O line pair SIO1 and $\overline{SIO1}$, and the bit line pair BL4 and $\overline{BL4}$ is connected to the sub I/O line pair SIO2 and $\overline{SIO2}$. When the control signals $\phi 4$ and $\phi 5$ are respectively changed to the "L" and "H" levels, the registers 60 are activated. Consequently, potential differences between the sub I/O line pair SIO1 and $\overline{SIO1}$ and between the sub I/O line pair SIO2 and $\overline{SIO2}$ are respectively amplified. In this case, each of the registers 60 serves as am amplifier.

In the above described manner, the data stored in the memory cell MC1 is read out onto the sub I/O line pair SIO1 and $\overline{SIO1}$, and the data stored in the memory cell MC4 is read out onto the sub I/O line pair SIO2 and $\overline{SIO2}$.

On the other hand, complementary data are applied to the input/output line pair I/O and $\overline{I/O}$. It is assumed here that inverted data of the data read out from the memory cell MC1 is applied. When the control signal $\phi 1$ is lowered to the "L" level, the sub I/O line pairs SIO1, $\overline{SIO1}$ and SIO2, $\overline{SIO2}$ are respectively disconnected from the corresponding nodes N11 and N12. In addition, when the switching signal SW1 is lowered to the "L" level, the bit line pair BL1 and $\overline{BL1}$ is disconnected from the sub I/O line pair SIO1 and $\overline{SIO1}$, and the bit line pair BL4 and $\overline{BL4}$ is disconnected from the sub I/O line pair SIO2 and $\overline{SIO2}$.

The control signals $\phi 4$ and $\phi 5$ are returned to an intermediate potential of a power-supply potential, and the column selecting signal $Y_i$ becomes the "H" level and the control signal $\phi 1$ becomes the "H" level. Consequently, the sub I/O line pair SIO1 and $\overline{SIO1}$ is connected to the input/output line pair I/O and $\overline{I/O}$ through the nodes N1 and N12. As a result, the data on the input/output line pair I/O and $\overline{I/O}$ are respectively transferred to the sub I/O line pair SIO1 and $\overline{SIO1}$ through the nodes N11 and N12. When the control signals $\phi 4$ and $\phi 5$ are respectively changed to the "L" and "H" levels, a potential difference between the sub I/O line pair SIO1 and $\overline{SIO1}$ is amplified.

Then, when the switching signal SW1 is raised to the "H" level, the bit line pair BL1 and $\overline{BL1}$ is connected to the sub I/O line pair SIO1 and $\overline{SIO1}$. Consequently, the data on the sub I/O line pair SIO1 and $\overline{SIO1}$ is transferred to the bit line pair BL1 and $\overline{BL1}$. As a result, the data on the bit line pair BL1 and $\overline{BL1}$ is inverted, so that the inverted data is written into the memory cell MC1.

Figure 8:
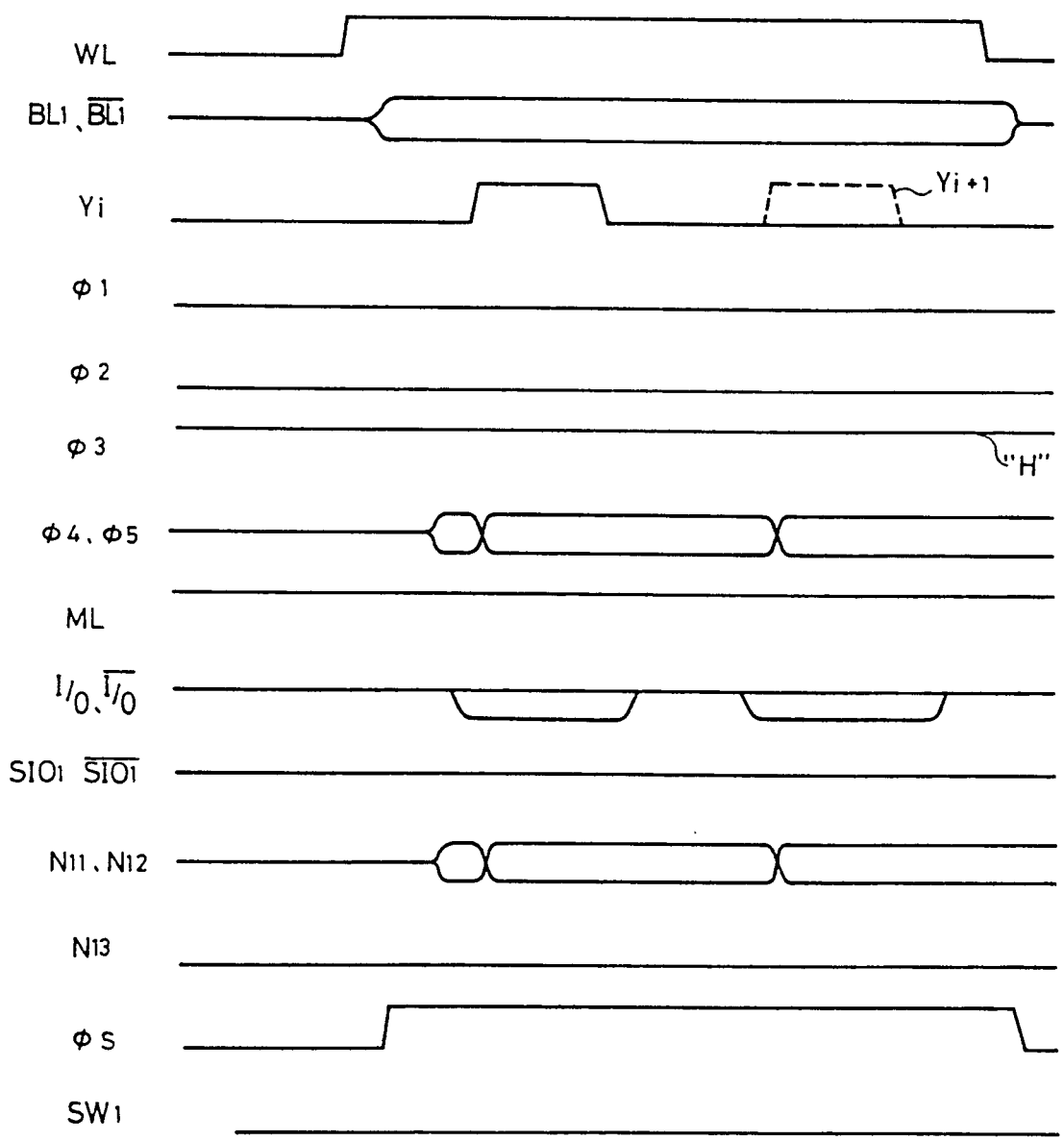
FIG. 8 is a timing chart for explaining an operation for writing expected data to registers in the semiconductor memory device shown in FIGS. 3 to 5.

FIG. 8 is a timing chart for explaining a write operation of expected data to the registers 60 in this semiconductor memory device.

First, a potential on the word line WL is raised to the "H" level. Consequently, data stored in the memory cell MC1 is read out onto the bit line BL1, and data stored in the memory cell MC2 is read out onto the bit line BL4. When the sense amplifier activating signal $\phi s$ is raised to the "H" level, the sense amplifiers SA are operated, so that potential differences between the bit line pair BL1 and $\overline{BL1}$ and between the bit line pair BL4 and $\overline{BL4}$ are respectively amplified. At that time, since the switching signal SW1 is at the "L" level, the bit line pairs BL1, $\overline{BL1}$ and BL4, $\overline{BL4}$ are respectively disconnected from the sub I/O line pairs SIO1, $\overline{SIO1}$ and SIO2, $\overline{SIO2}$. In addition, since the control signal $\phi 1$ is at the "L" level, the sub I/O line pairs SIO1, $\overline{SIO1}$ and SIO2, $\overline{SIO2}$ are respectively disconnected from the corresponding nodes N11 and N12.

Then, complementary expected data are applied to the input/output line pair I/O and $\overline{I/O}$. When the column selecting signal $Y_i$ is raised to the "H" level, the nodes N11 and N12 corresponding to the sub I/O line pair SIO1 and $\overline{SIO1}$ connected to the input/output line pair I/O and $\overline{I/O}$. Consequently, the expected data on the input/output line pair I/O and I/O is transferred to the nodes N11 and N12. When the control signals $\phi 4$ and $\phi 5$ are respectively changed to the "L" and "H" levels, the registers 60 are activated. Consequently, a potential difference between the nodes N11 and N12 is amplified. As a result, data on the nodes N11 and N12 are held in the corresponding register 60. When the column selecting signal $Y_i$ is lowered to the "L" level, the nodes N11 and N12 are disconnected from the input/output line pair I/O and $\overline{I/O}$.

Then, new expected data is applied to the input/output line pair I/O and $\overline{I/O}$. When the column selecting signal $Y_{i+1}$ is raised to the "H" level, the nodes N11 and N12 corresponding to the sub I/O line pair SIO2 and $\overline{SIO2}$ are connected to the input/output line pair I/O and $\overline{I/O}$. Consequently, the expected data on the input/output line pair I/O and O is transferred to the nodes N11 and N12. When the control signals $\phi 4$ and $\phi 5$ are respectively changed to the "L" and "H" levels, the registers 60 are activated. Consequently, a potential difference between the nodes N11 and N12 is amplified. As a result, the expected data is held in the corresponding register 60. When the column selecting signal $Y_{i+1}$ is lowered to the "L" level, the nodes N11 and N12 are disconnected from the input/output line pair I/O and I/O.

In the above described manner, the expected data is written in each of the registers 60. In this case, each of the registers 60 serves as a latch circuit. Meanwhile, a refresh operation is performed with respect to the memory cells MC1 and MC2.

Figure 9:
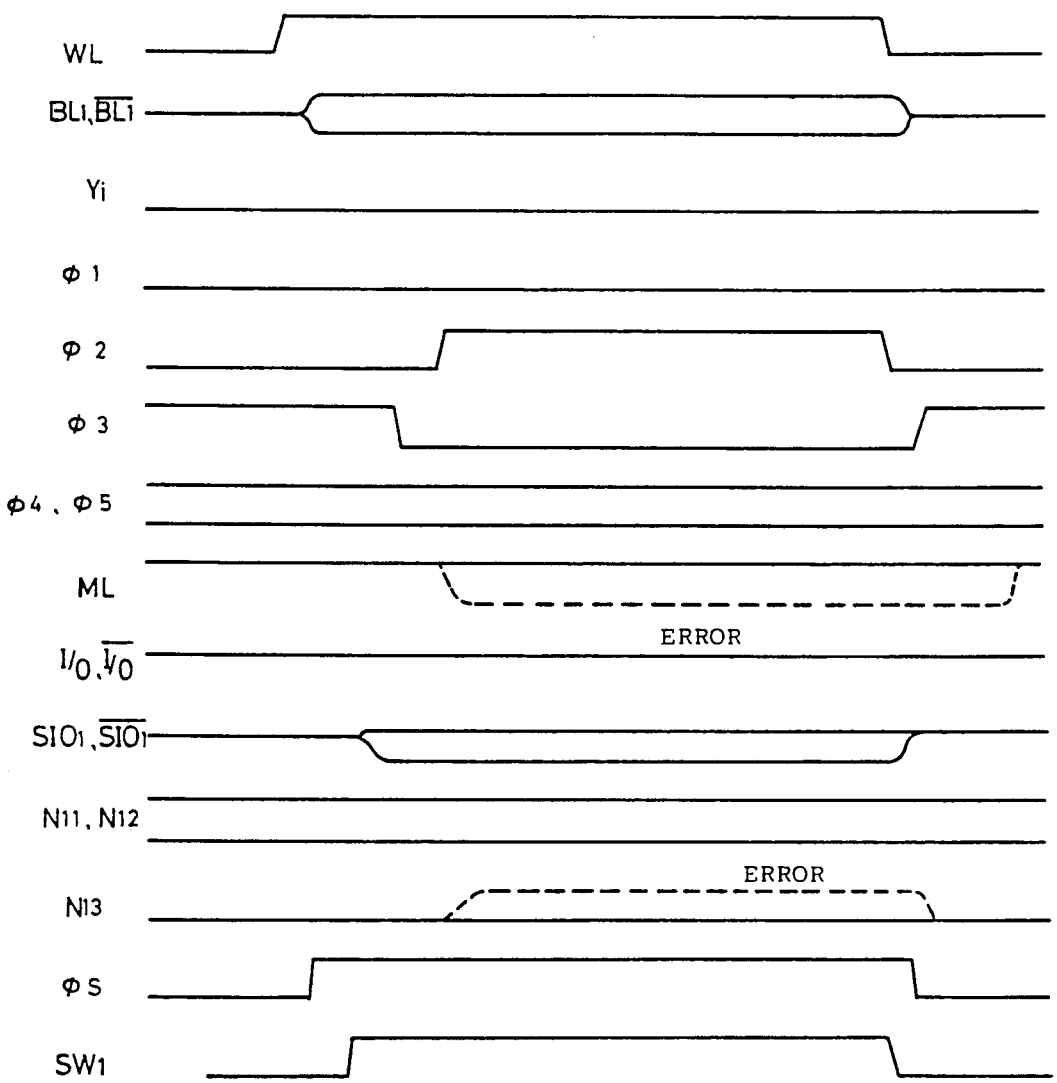
FIG. 9 is a timing chart for explaining a match operation in the semiconductor memory device shown in FIGS. 3 to 5.

FIG. 9 is a timing chart for explaining a match operation in this semiconductor memory device. In this case, the match line ML is precharged at the "H" level in advance.

First, a potential on the word line WL is raised to the "H" level. Consequently, data stored in the memory cell MC1 is read out onto the bit line BL1, and data stored in the memory cell MC2 is read out onto the bit line BL4. When the sense amplifier activating signal $\phi s$ is raised to the "H" level, the sense amplifiers SA are operated. Consequently, potential differences between the bit line pair BL1 and $\overline{BL1}$ and between the bit line pair BL4 and $\overline{BL4}$ are respectively amplified. When the switching signal SW1 is raised to the "H" level, the bit line pair BL1 and $\overline{BL1}$ is connected to the sub I/O line pair SIO1 and $\overline{SIO1}$, and the bit line pair BL4 and $\overline{BL4}$ is connected to the sub I/O line pair SIO2 and $\overline{SIO2}$. Consequently, the data read out from the memory cell MC1 is transferred to the sub I/O line pair SIO1 and $\overline{SIO1}$, and the data read out from the memory cell MC2 is transferred to the sub I/O line pair SIO2 and $\overline{SIO2}$.

Then, the control signal $\phi 3$ is lowered to the "L" level. Consequently, the transistor Q17 in each of the comparators 50 is turned off. In addition, the control signal $\phi 2$ is raised to the "H" level. Consequently, the transistors Q13 and Q14 are turned on, so that the sub I/O line pairs SIO1, $\overline{SIO1}$ and SIO2, $\overline{SIO2}$ are respectively connected to the corresponding comparators 50.

When the data read out onto the sub I/O line pair SIO1 and $\overline{SIO1}$ from the memory cell MC1 matches expected data held in the nodes N11 and N12 by the corresponding register 60, a potential of the node N13 becomes the "L" level. Therefore, the transistor Q18 remains off. Similarly, when the data read out onto the sub I/O line pair SIO2 and $\overline{SIO2}$ from the memory cell MC2 matches the expected data held in the nodes N11 and N12 by the corresponding register 60, the corresponding transistor Q18 remains off. Thus, the match line ML remains at the "H" level.

However, when the data read out onto the sub I/O line pair SIO1 and $\overline{\text{SIO1}}$ from the memory cell MC1 does not match the expected data held in the corresponding nodes N11 and N12, the potential of the node N13 becomes the "H" level represented by a broken line. Therefore, the transistor Q18 is turned on, so that the match line ML is discharged such that a potential thereon becomes the "L" level represented by a broken line. Similarly, when the data read out onto the sub I/O line pair SIO2 and $\overline{\text{SIO2}}$ from the memory cell MC2 does not match the expected data held in the corresponding nodes N11 and N12, the match line ML is discharged such that a potential thereon becomes the "L" level. More specifically, the match line ML is connected to all the line test registers 70 in an OR manner. Thus, if at least one of a row of memory cells connected to a single word line is defective, the potential on the match line ML becomes the "L" level. On the other hand, if all a row of memory cells connected to a single word line are normal, the potential on the match line ML remains at the "H" level.

As described in the forgoing, in this semiconductor memory device, each of the registers 60 serves as a preamplifier for a sub I/O line pair at the time of ordinary read and write operations, while serving as a data latch for holding expected data at the time of testing.

Since the register portion 6 comprising the plurality of registers 60 can hold random data, the random data can be used as expected data. Thus, a line test based on random test data can be performed.

Figure 10:
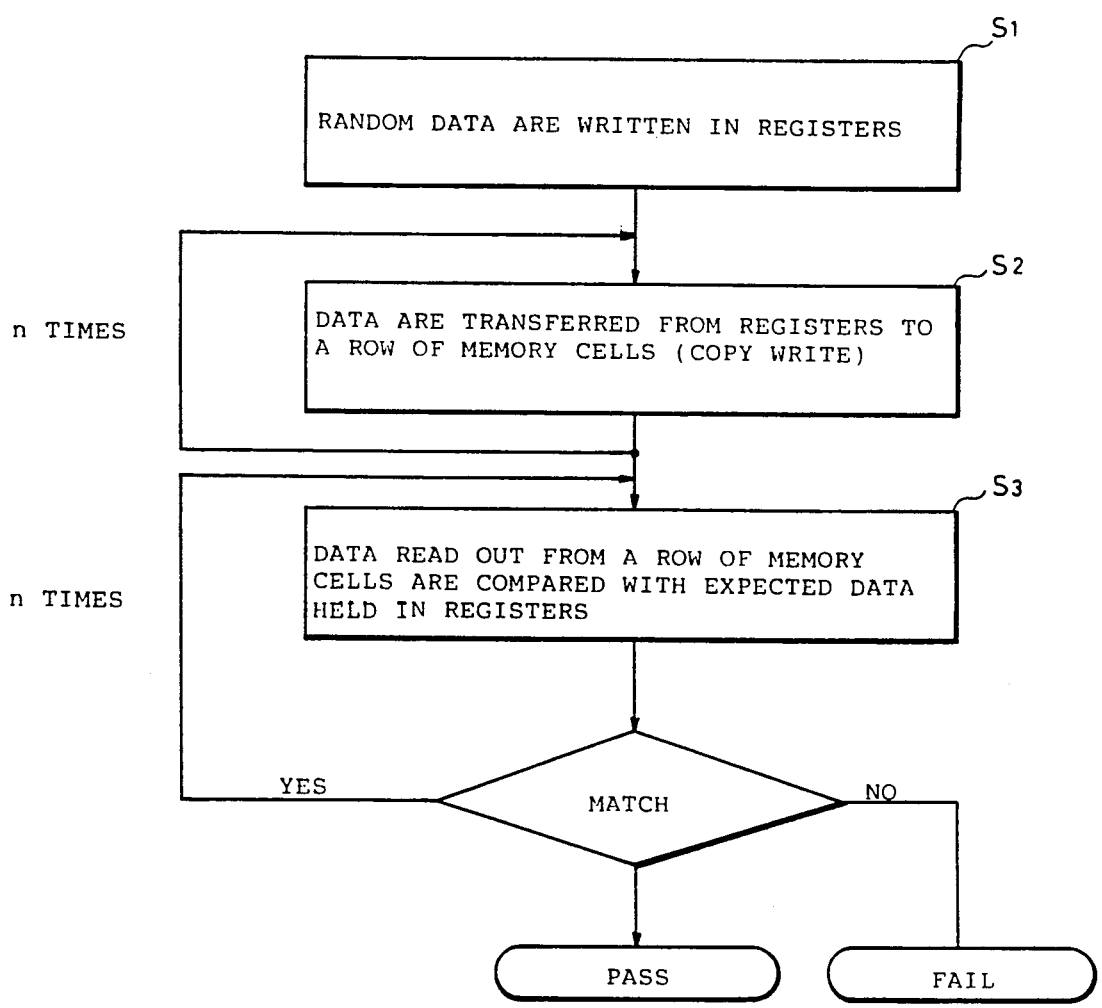
FIG. 10 is a flow chart for explaining a line test mode.

Referring now to FIGS. 10 to 12, description is made on a line test mode of this semiconductor memory device.

In FIG. 11A, random data are written in registers 60 (in the step S1 shown in FIG. 10). Then, the data held in registers 60 are transferred to a row of memory cells MC1 to MC4 connected to a single word line WL (in the step S2). The operation in the step S2 is performed with respect to all word lines. Consequently, data are written into all memory cells.

Figure 11B:
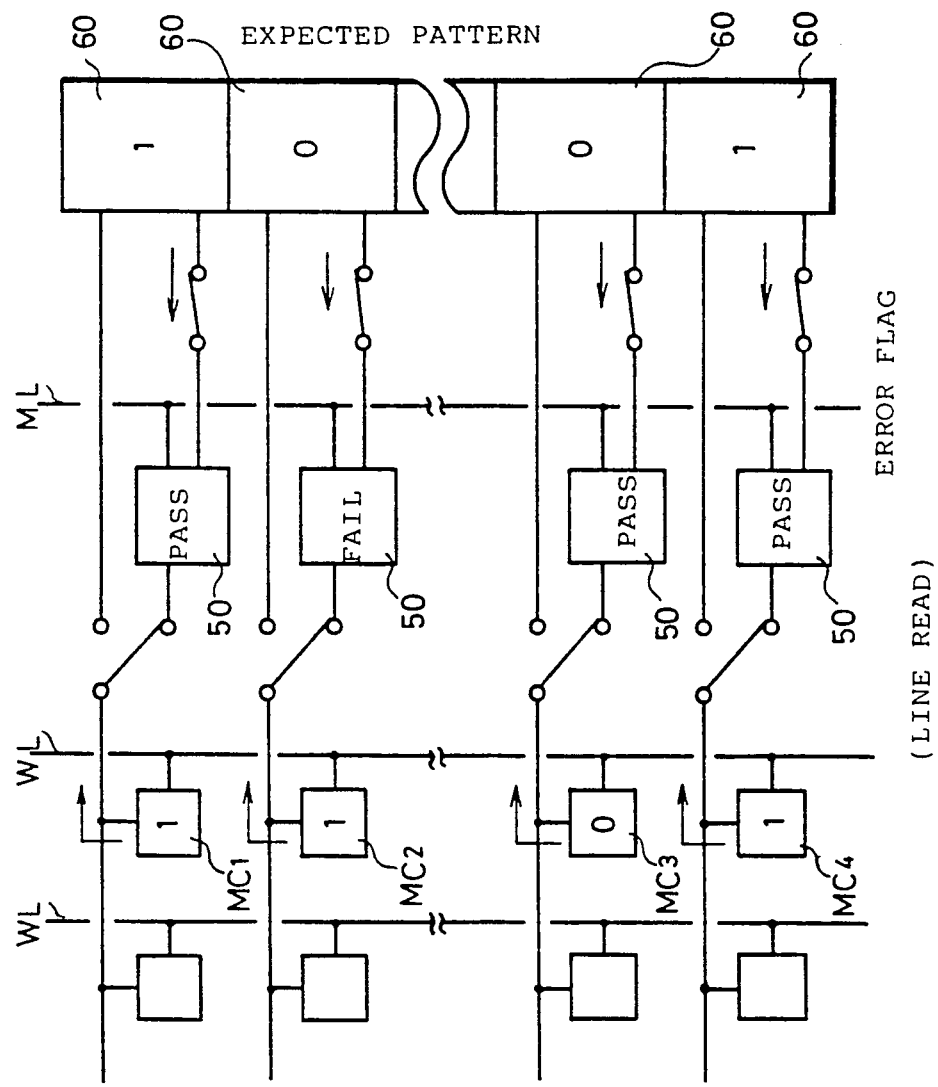
FIG. 11B is a typical diagram for explaining an operation for detecting a match of data read out from a row of memory cells and expected data held in registers.

In FIG. 11B, data read out from a row of memory cells MC1 to MC4 connected to a single word line WL are compared with data (expected data) held in the registers 60 in comparators 50 (in the step S3). In FIG. IIB, it is assumed that data "0" written in the memory cell MC2 is inverted to "1" because the memory cell MC2 is defective. In this case, a match line ML is discharged by the corresponding comparator 50 such that a potential thereon becomes the "L" level. The operation in the step S3 is performed with respect to all word lines. Therefore, data stored in all memory cells are tested.

In the above described manner, a line test based on random test data can be performed. Thus, pattern sensitivity or the like can be checked by arbitrarily setting a pattern of test data. More specifically, leakage between adjacent memory cells, or the like can be detected by writing different data into the adjacent memory cells. Meanwhile, it takes a longer time to write or read out data to or from a memory cell than to write data into a register 60. In the above described embodiment, data are simultaneously written from the registers 60 to a plurality of memory cells connected to a single word line. In addition, data are simultaneously read out from a plurality of memory cells connected to a single word line, and the data are simultaneously compared with expected data held in the registers 60. Thus, a test based on random data can be performed for a short time. Although in the example shown in FIGS. 10 to 11B, data of the same pattern are written into respective rows, data of different patterns can be written into the respective rows.

Figure 12A:
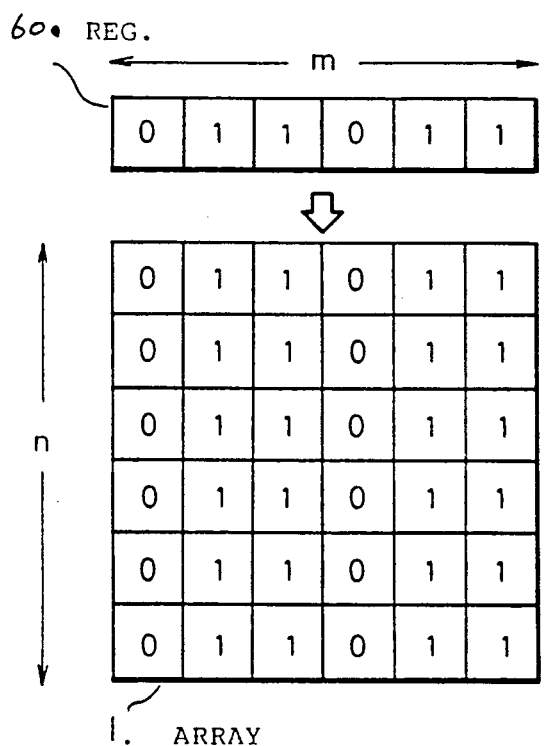
FIG. 12A is a diagram showing one example of a pattern of test data.

Let's consider test time required for a test based on test data of a pattern shown in FIG. 12A.

It is assumed that one cycle time is $t_c$. Time required for writing data "0111011" in m-bit registers 60 is $t_c m$. Time required for writing the m-bit data stored in the registers 60 into n rows in a memory array 1 is $t_c n$. Time required for reading out data stored in all rows in the memory array 1 and comparing the same with the m-bit data stored in the registers 60 is $t_c n$. Thus, test time T1 is as follows:

$$T1 = t_c \cdot m + t_c \cdot n + t_c \cdot n$$
$$= t_c (m + 2n)$$

If m is equal to n, the test time T1 is $3nt_c$.

Figure 12B:
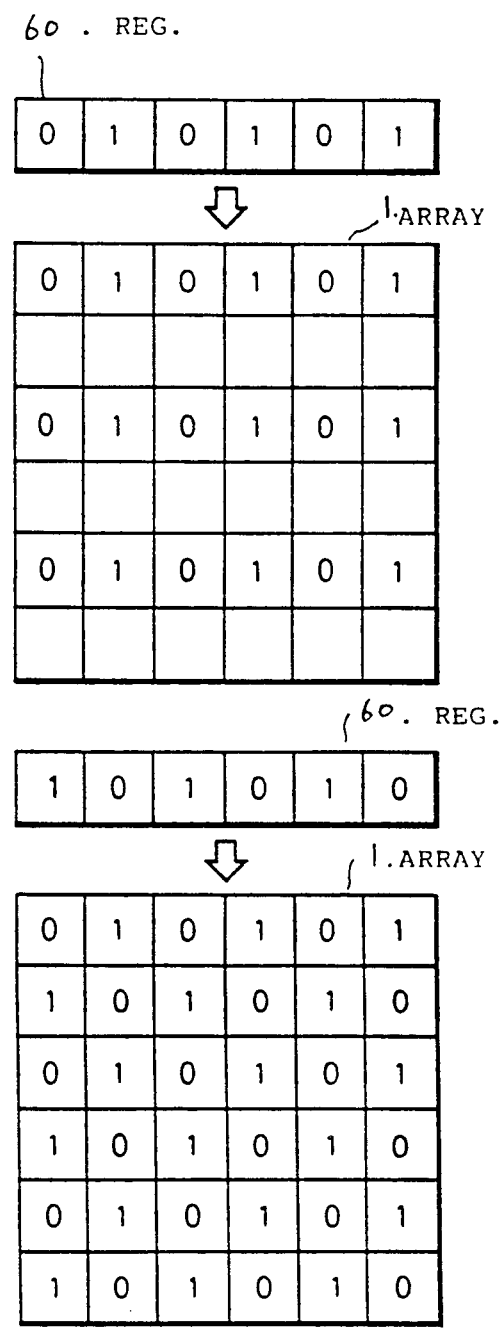
FIG. 12B is a diagram for explaining test time of a test based on a pattern referred to as a checker board.

In the case of a test using a test pattern referred to as a checker board, data writing is performed as shown in FIG. 12B.

First, data "010101" are written in the registers 60. Then, the data "010101" stored in the registers 60 are written in alternate rows in the memory array 1. Thereafter, data "101010" obtained by inverting the data "010101" are written in the registers 60. Then, the data "101010" stored in the registers 60 are written in the remaining alternate rows in the memory array 1.

Expected data "010101" are written in the registers 60. Then, the data in the alternate rows in the memory array 1 are sequentially read out and compared with the expected data in the registers 60. Thereafter, expective data "101010" are written in the registers 60. Then, the data in the remaining alternate rows in the memory array 1 are sequentially read out and compared with the expected data in the register 60.

Test time T2 in the above described case is as follows:

$$\begin{aligned}T2 &= t_c \cdot m + t_c \cdot (n/2) + \\ &\quad t_c \cdot m + t_c \cdot (n/2) + \\ &\quad t_c \cdot m + t_c \cdot (n/2) + \\ &\quad t_c \cdot m + t_c \cdot (n/2) \\ &= t_c (4m + 2n)\end{aligned}$$

If m is equal to n, the test time T2 is $6nt_c$. On the other hand, in the conventional testing method, test time T3 is as follows:

$$T3 = t_c (m \cdot n) \cdot 2$$

If m is equal to n, the test time T3 is $2n^2 t_c$.

The test data can be externally applied by the tester 11(see FIG. 3). In addition, a test data generator for generating test data can be provided inside of the semiconductor memory device.

Figure 13:
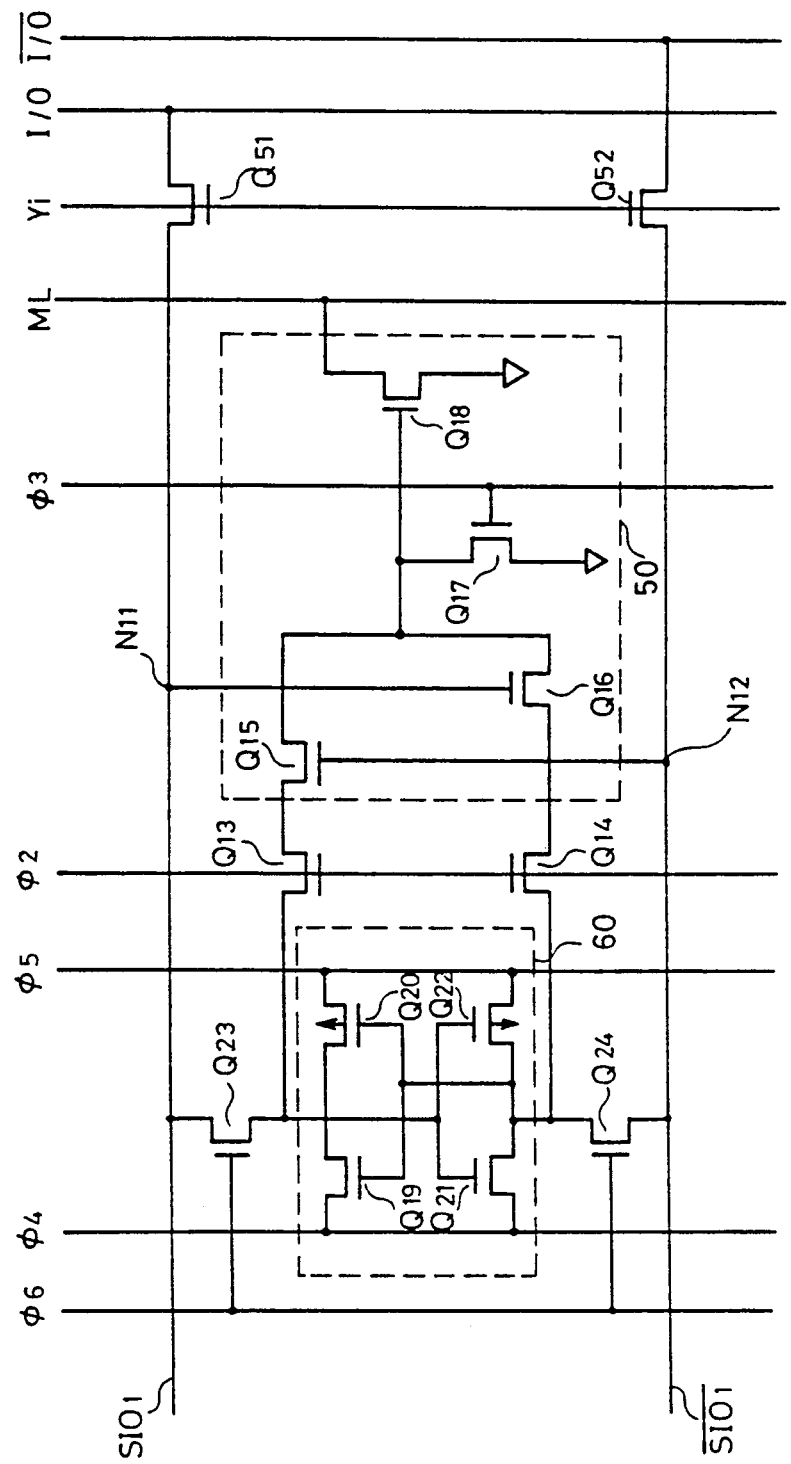
FIG. 13 is a circuit diagram showing a structure of a main portion of a semiconductor memory device comprising an on-chip test circuit according to another embodiment of the present invention.

FIG. 13 is a circuit diagram showing a structure of a main portion of a semiconductor memory device according to another embodiment of the present invention.

In the semiconductor memory device shown in FIG. 13, sub I/O lines SIO1 and $\overline{\text{SIO1}}$ are directly connected to nodes N11 and N12, respectively. In addition, a register 60 is connected to the sub I/O line pair SIO1 and $\overline{SIO1}$ through N channel MOS transistors Q23 and Q24. The transistors Q23 and Q24 have their gates receiving a control signal $\phi 6$ from the timing generator 9 (in FIG. 3). A comparator 50 is connected to the sub I/O line SIO1 through a transistor Q13 and the transistor Q23, and connected to the sub I/O line $\overline{SIO1}$ through a transistor Q14 and the transistor Q24.

In the semiconductor memory device shown in FIG. 13, when a column selecting signal $Y_i$ becomes the "H" level, the sub I/O line pair SIO1 and $\overline{SIO1}$ is directly connected to an input/output line pair I/O and $\overline{I/O}$. Therefore, at the time of writing data to the register 60, the data applied to the input/output line pair I/O and $\overline{I/O}$ is first transferred to the sub I/O line pair SIO1 and $\overline{SIO1}$. Thereafter, the control signal $\phi 6$ is raised to the "H" level, so that the transistors Q23 and Q24 are turned on. As a result, the data on the sub I/O line pair SIO1 and $\overline{SIO1}$ is written into the register 60. Meanwhile, the control signal $\phi 6$ is rendered active (becomes the "H" level) at the same timings as those of control signals $\phi 4$ and $\phi 5$ shown in FIGS. 6 to 9.

At the time of an ordinary write operation, data is read out onto the sub I/O line pair SIO1 and $\overline{SIO1}$ from a memory cell and then, the transistors Q23 and Q24 are turned on. Thereafter, the register 60 is activated, so that amplification of data is assisted. In this case, the register 60 serves as an intermediate amplifier for the data on the sub I/O line pair SIO1 and $\overline{SIO1}$.

On the other hand, the register 60 can have another function of holding another data without relating to amplification of data. In this case, a register portion 6 can be used as a static random memory.

In an ordinary write operation, the register 60 can be used as an intermediate amplifier for assisting amplification of data on the sub I/O line pair SIO1 and $\overline{SIO1}$. In addition, separate data can be written in the memory cell and the register 60 without the register 60 relating to amplification of data.

Figure 14:
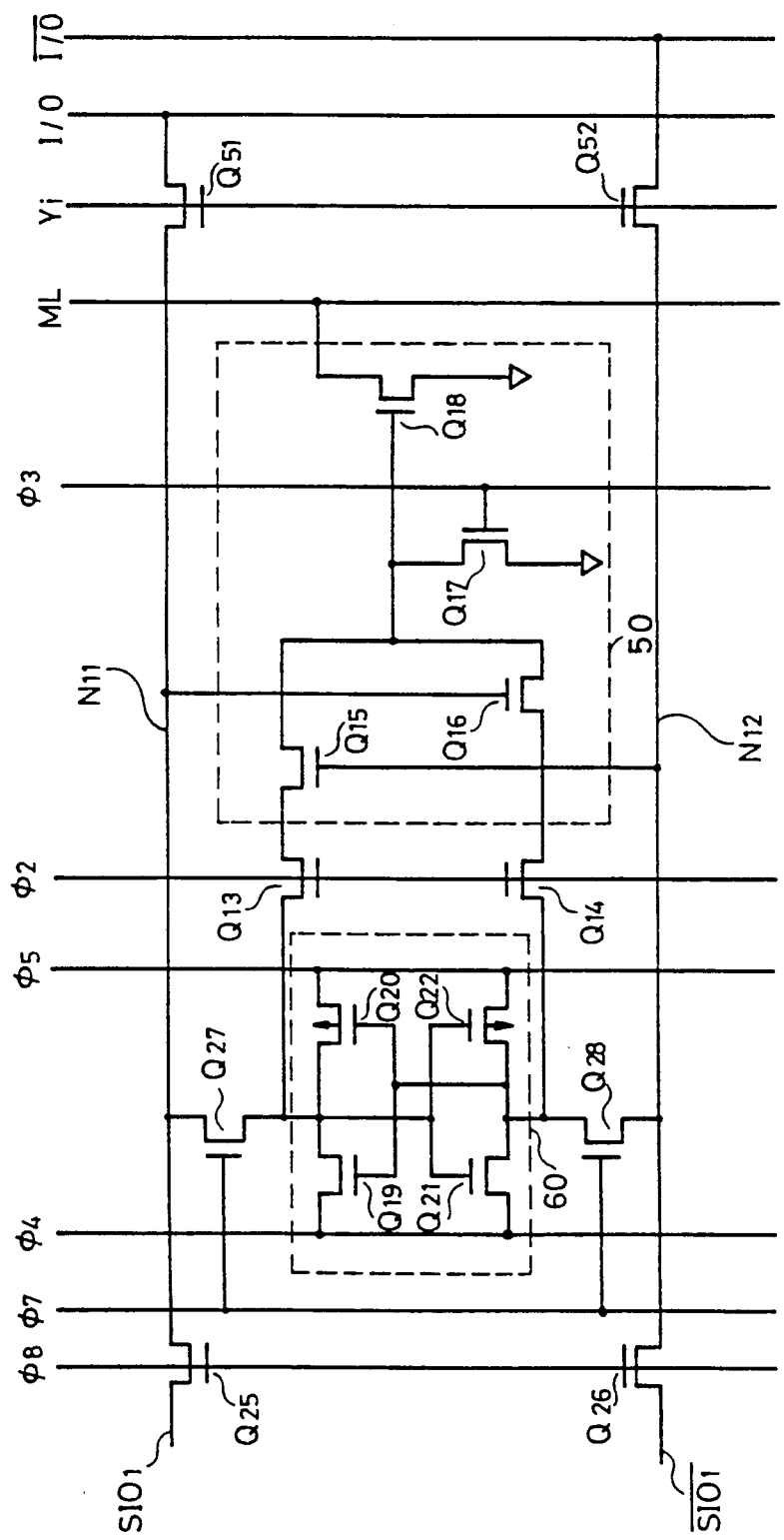
FIG. 14 is a circuit diagram showing a structure of a main portion of a semiconductor memory device comprising an on-chip test circuit according to still another embodiment of the present invention.

FIG. 14 is a circuit diagram showing a structure of a main portion of a semiconductor memory device according to still another embodiment of the present invention.

In the semiconductor memory device shown in FIG. 14, I/O lines SIO1 and $\overline{SIO1}$ are respectively connected to nodes N11 and N12 through N channel MOS transistors Q25 and Q26. The transistors Q25 and Q26 have their gates receiving a control signal $\phi 8$ from the timing generator 9 (in FIG. 3). Meanwhile, transistors Q27 and Q28 respectively correspond to the transistors Q23 and Q24 shown in FIG. 13. In addition, a control signal $\phi 7$ corresponds to the control signal $\phi 6$ shown in FIG. 13. The control signal $\phi 8$ is changed at the same timings as those of the control signal $\phi 1$ shown in FIGS. 6 to 10.

In the semiconductor memory device shown in FIG. 14, the same function as that of the semiconductor memory device shown in FIG. 13 is achieved. However, in the semiconductor memory device shown in FIG. 14, data can be inputted to the nodes N11 and N12 with the nodes N11 and N12 being disconnected from the sub I/O line pair SIO1 and $\overline{SIO1}$. Therefore, additional capacitances connected to the nodes N11 and N12 can be decreased. As a result, higher speed and lower power consumption are achieved.

Figure 15:
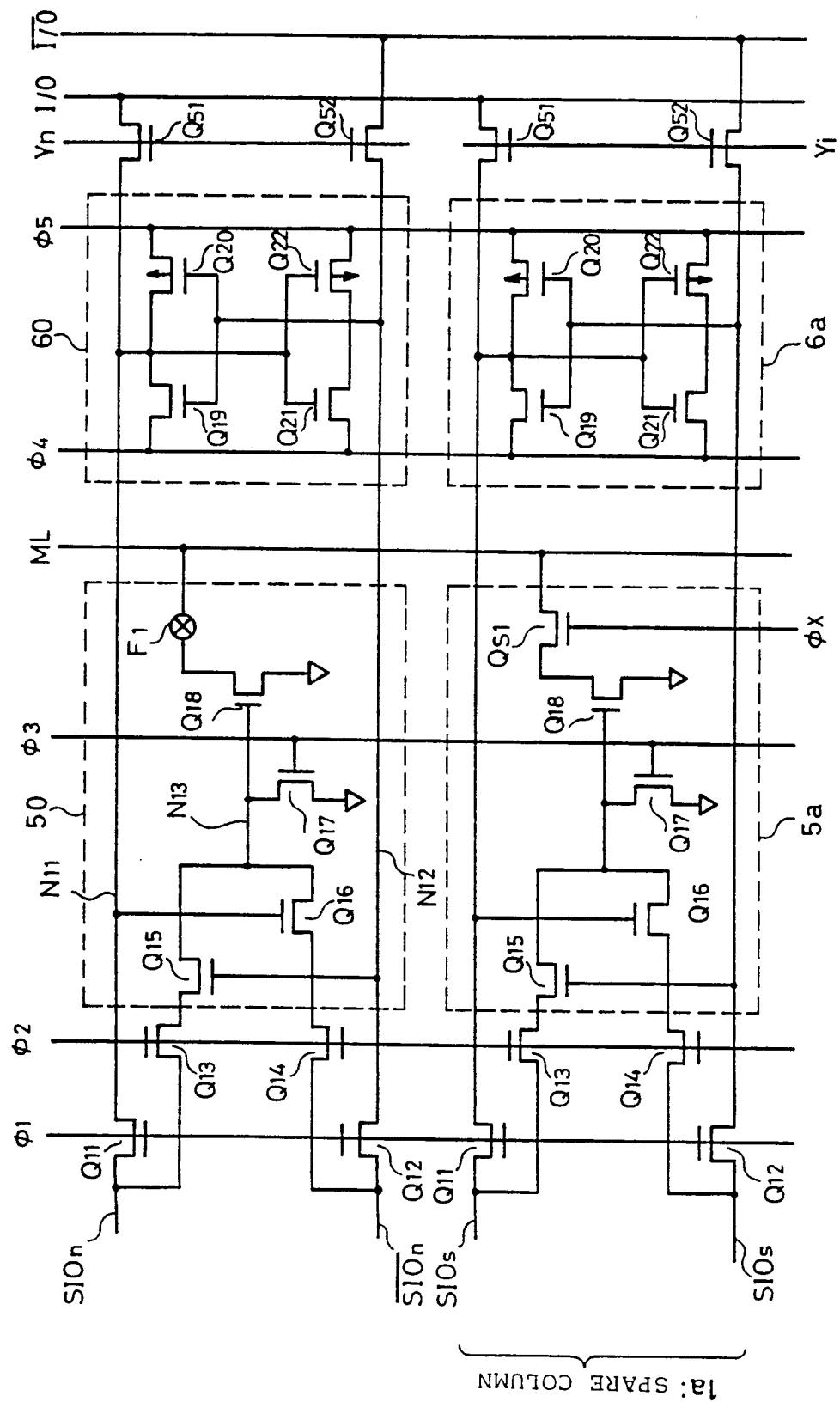
FIG. 15 is a circuit diagram showing a structure of a main portion of a semiconductor memory device comprising an on-chip test circuit according to a further embodiment of the present invention.

Additionally, in a recent large capacity semiconductor memory device, a redundant circuit is generally provided for improve the yield. FIG. 15 is a circuit diagram showing a structure taken when the embodiment shown in FIG. 5 is applied to the semiconductor memory device comprising a redundant circuit.

As shown in FIG. 3, the redundant circuit comprises the spare column 1a, the spare column decoder 4a, the spare comparator 5a, and the spare register 6a. In FIG. 15, structures of a comparator 50 and a register 60 connected to a sub I/O line pair SIOn and $\overline{SIOn}$ included in a memory cell array 1 are the same as those shown in FIG. 5 except that a fuse F1 is connected between a transistor Q18 and a match line ML. In addition, structures of a spare sub I/O line pair SIOs and $\overline{SIOs}$, the spare comparator 5a and the spare register 6a included in the spare column 1a are the same as those of the sub I/O line pair SIOn and $\overline{SIOn}$, the comparator 50 and the register 60 except that an N channel transistor Qs1 is connected between a transistor Q18 and the match line ML. A sub I/O line pair SIOn and $\overline{SIOn}$ is connected to normal memory cells in the same manner as shown in FIG. 4, and the spare sub I/O line pair SIOs and $\overline{SISs}$ is connected to spare memory cells. The transistor Qs1 in the spare comparator 5a has its gate receiving a redundant circuit activating signal $\phi x$ from a signal generating circuit shown in FIG. 16.

Figure 16:
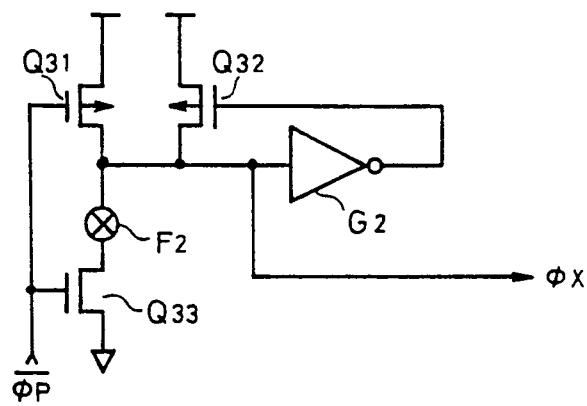
FIG. 16 is a diagram showing a structure of a circuit for generating a redundant circuit activating signal.
Figure 17:
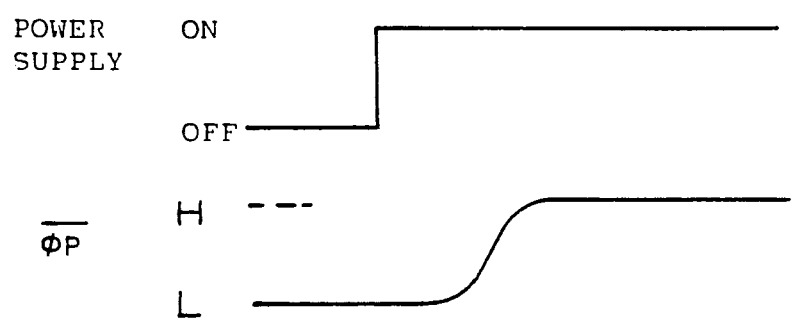
FIG. 17 is a waveform diagram of a control signal for activating the circuit shown in FIG. 16.

The signal generating circuit shown in FIG. 16 comprises P channel MOS transistors Q31 and Q32, an N channel transistor Q33, an inverter G2 and a fuse F2. The transistors Q31 and Q33 have their gates receiving a control signal $\overline{\phi p}$. The control signal $\overline{\phi p}$ is at the "L" level when the power supply is turned off while becoming the "H" level after a lapse of a constant time period from the time when the power supply is turned on, as shown in FIG. 17. When the redundant circuit is not employed, the fuse F2 is not blown out. Considering a case in which the fuse F2 is not blown out, if the control signal $\overline{\phi p}$ becomes the "H" level after the power supply is turned on, the redundant circuit activating signal $\phi x$ is latched at the "L".

On the other hand, when the redundant circuit is employed, the fuse F2 is blown out. In this case, even if the control signal $\overline{\phi p}$ becomes the "H" level after the power supply is turned on, the redundant circuit activating signal $\phi x$ remains at the "H" level.

In FIG. 15, when the redundant circuit is not employed, the fuse F1 in the comparator 50 is not blown out. In addition, since the redundant circuit activating signal $\phi x$ remains at the "L" level, the spare comparator 5a is disconnected from the match line ML. More specifically, information from the spare memory cells are not reflected on the match line ML, so that the spare column 1a is beyond an object of a test.

Additionally, when the redundant circuit is employed, the fuse F1 in the comparator 50 is blown out. Consequently, the comparator 50 is disconnected from the match line ML. In this case, since the redundant circuit activating signal $\phi x$ becomes the "H" level, the spare comparator 5a is connected to the match line ML. More specifically, a portion corresponding to the sub input/output line pair SIOn and $\overline{SIOn}$ is replaced with a portion corresponding to the spare sub I/O line pair SIOs and $\overline{SIOs}$. Therefore, the spare memory cells become an object of a test.

Thus, even in the large capacity semiconductor memory device comprising a redundant circuit, a line test can be performed.

Figure 18:
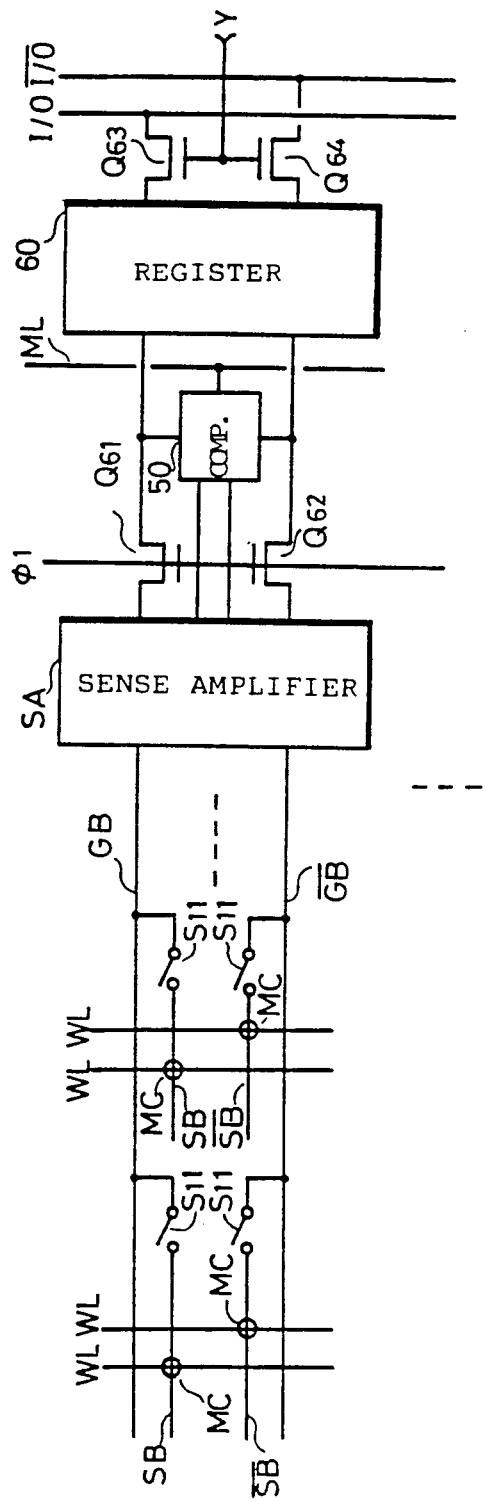
FIG. 18 is a circuit diagram showing a structure of a main portion of a semiconductor memory device comprising an on-chip test circuit according to a further embodiment of the present invention.

FIG. 18 is a diagram showing a structure of a semiconductor memory device according to a further embodiment of the present invention.

In FIG. 18, a plurality of segment bit line pairs SB and $\overline{SB}$ are respectively connected to a global bit line pair GB and $\overline{GB}$ through switches S11. A plurality of word lines WL are arranged intersecting with each of the segment bit line pairs SB and $\overline{SB}$, memory cells MC being provided at intersections thereof. A sense amplifier SA is connected to the global bit line pair GB and $\overline{GB}$. The sense amplifier SA is connected to a register 60 through N channel MOS transistors Q61 and Q62. A comparator 50 compares data on the global bit line pair GB and $\overline{GB}$ with data held in the register 60. The register 60 is connected to an input/output line pair I/O and $\overline{I/O}$ through N channel MOS transistors Q63 and Q64. At the time of a normal read operation, the transistors Q61 and Q62 are turned on in response to a control signal $\phi 1$. Data stored in a selected memory cell MC is read out to the global bit line pair GB and $\overline{GB}$ through the segment bit line pair SB and $\overline{SB}$, to be amplified by the sense amplifier SA. When the transistors Q63 and Q64 are turned on in response to a column selecting signal Y, the data amplified by the sense amplifier SA is read out to the input/output line pair I/O and $\overline{I/O}$ through the register 60.

Similarly, at the time of a normal write operation, the transistors Q61 and Q62 are turned on in response to the control signal $\phi 1$. The transistors Q63 and Q64 are turned on in response to the column selecting signal Y, data applied to the input/output line pair I/O and $\overline{I/O}$ is applied to the global bit line pair GB and $\overline{GB}$ through the register 60 and the sense amplifier SA. The data on the global bit line pair GB and GB is written in the selected memory cell MC through the segment bit line pair SB and $\overline{SB}$.

At the time of a copy write operation, the transistors Q61 and Q62 are turned on in response to the control signal $\phi 1$. The data held in the register 60 is written in the selected memory cell MC through the global bit line pair GB and $\overline{GB}$ and the segment bit line pair SB and $\overline{SB}$.

At the time of a line read operation, the transistors Q61 and Q62 are turned off in response to the control signal $\phi 1$. The data stored in the selected memory cell MC is applied to the sense amplifier SA through the segment bit line pair SB and $\overline{SB}$ and the global bit line pair GB and $\overline{GB}$, to be amplified. The data amplified by the sense amplifier SA is compared with the data held in the register 60 by the comparator 50. The result of the comparison is outputted to a match line ML.

Figure 19:
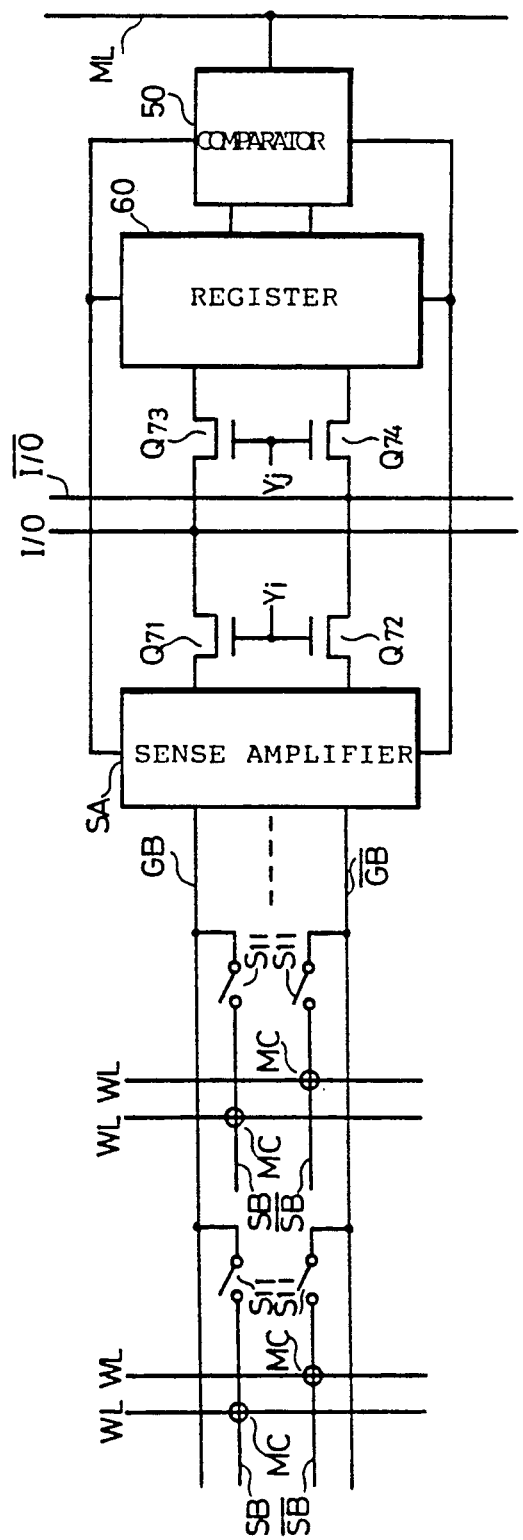
FIG. 19 is a circuit diagram showing a structure of a main portion of a semiconductor memory device comprising an on-chip test circuit according to a still further embodiment of the present invention.

FIG. 19 is a diagram showing a structure of a semiconductor memory device according to a still further embodiment of the present invention.

In FIG. 19, an input/output line pair I/O and $\overline{I/O}$ is connected to a sense amplifier SA through N channel MOS transistors Q71 and Q72, and connected to a register 60 through N channel MOS transistors Q 73 and Q74. A comparator 50 compares data amplified by the sense amplifier SA with data held in the register 60. Structures of other portions are the same as those shown in FIG. 18.

In the semiconductor memory device shown in FIG. 19, the register 60 need not be operated in normal read and write operations. Other operations are the same as those in the semiconductor memory device shown in FIG. 18.

As described in the foregoing, according to the present invention, since random data can be held in a plurality of holding means provided corresponding to a plurality of sub-input/output lines, a line test corresponding to a pattern of random or arbitrary data can be performed only by providing a few additional circuits. Thus, a test having high test sensitivity can be performed at reduced test time.

Additionally, at the time of normal read and write operations, the plurality of holding means can respectively serve as auxiliary amplifiers for the sub-input/output lines. In addition, the plurality of holding means can be operated independent of the normal read and write operations. Thus, the plurality of holding means can perform a multi-function, specifically as a register, as an intermediate amplifier and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An on chip apparatus for testing a semiconductor structure using arbitrary test patterns having at least a pair of data line portions connected to a plurality of memory cells comprising:

means for controlling read-write operations of said plurality of memory cells, register means for receiving and holding respective bits of one of said arbitrary test patterns, comparator means having one input connected to said register means, transfer gate means for connecting said respective bits of said one of said arbitrary test patterns held in said register means to a pair of connector lines identified with at least one said pair of data lines during a write operation and thereafter isolating said pair of connector lines from said register means and connecting said pair of connector lines to a further input of said comparator means during a read operation, whereby said comparator means provides a comparison of data written into and read from said memory cells.

2. A semiconductor memory device comprising:

a plurality of groups of bit lines (BL1, BL3/ ~BL3, $\overline{BL3}$; BL4, $\overline{BL4}$/ ~BL6, $\overline{BL6}$/ ) each comprising a plurality of bit lines, a plurality of word lines (WL) arranged intersecting with said plurality of bit lines (BL1, $\overline{BL1}$/ ~BL6, $\overline{BL6}$/ ), a plurality of memory cells (MC1, MC2), respectively provided at intersections of said plurality of bit lines (BL1, $\overline{BL1}$/ ~BL6, $\overline{BL6}$/ ) and said plurality of word lines (WL), for storing information, a plurality of sub-input/output lines (SIO1, $\overline{SIO1}$/ ; SIO2, $\overline{SIO2}$/ ) each provided corresponding to each of said plurality of groups of bit lines, an input/output line (I/O, $\overline{I/O}$/ ) common to said plurality of sub-input/output lines (SIO1, $\overline{SIO1}$/ ; SIO2, $\overline{SIO2}$/ ), a plurality of first switching means (S1~S6) each connected between each of said plurality of bit lines (BL1, $\overline{BL1}$/ ~BL6, $\overline{BL6}$/ ) and the corresponding sub-input/output line (SIO1, $\overline{SIO1}$/ ; SIO2, SIO2/ ), a plurality of second switching means (Q51, Q52) each connected between each of said plurality of sub-input/output lines (SIO1, $\overline{SIO1}$/ ; SIO2, $\overline{SIO2}$/ ) and said input/output line (I/O, $\overline{I/O}$/ ), a plurality of holding means (60) each provided corresponding to each of said plurality of sub-input- /output lines (SIO1, $\overline{SIO1}$/ ; SIO2, $\overline{SIO2}$/ ) for holding information corresponding to said sub-input/output line, and a plurality of comparing means (50) each provided corresponding to each of said plurality of sub-input/output lines (SIO1, $\overline{SIO1}$/ ; SIO2, $\overline{SIO2}$/ ) for determining whether or not the information held in the corresponding holding means (60) matches the information on the corresponding sub-input/output line.

3. The semiconductor memory device according to claim 2, which further comprises first selecting means (2) for selecting any one of said plurality of first switching means (S1~S6), to render the same conductive, and second selecting means (4) for selecting any one of said plurality of second switching means (Q51, Q52), to render the same conductive.

4. The semiconductor memory device according to claim 3, which further comprises third selecting means (3) for selecting any one of said plurality of word lines (WL).

5. The semiconductor memory device according to claim 2, which further comprises a match line (ML) common to said plurality of comparing means (50) and to which a mismatch detecting signal is outputted when at least one of said plurality of comparing means (50) detects a mismatch.

6. The semiconductor memory device according to claim 5, wherein each of said plurality of comparing means (50) comprises first logic processing means (Q15, Q16) for performing an exclusive operation of the information held in the corresponding holding means (60) and the information on the corresponding sub-input-output line (SIO1, $\overline{SIO1}$/ ; SIO2, $\overline{SIO2}$/ ).

7. The semiconductory memory device according to claim 6, wherein each of said plurality of comparing means (50) further comprises second logic processing means (Q18) got connecting an output of said first logic processing means to said match line ML in a wired-OR manner.

8. The semiconductor memory device according to claim 2, wherein each of said plurality of bit lines comprises a bit line pair (BL1, $\overline{BL1}$/ ~ BL6, $\overline{BL6}$/ ) receiving complimentary information, each of said plurality of sub-input/output lines comprises a sub-input/output line pair (SIO1, SIO1/ ; SIO2, $\overline{SIO2}$/ ) receiving complimentary information, and said input/output line comprises an input/output line pair (I/O, $\overline{I/O}$/ ) receiving complimentary information.

9. The semiconductor memory device according to claim 8, wherein each of said plurality of holding means (60) comprises a plurality of devices (Q19~Q22) cross-coupled between the corresponding bit line pair (BL1, $\overline{BL1}$/ ~BL6, $\overline{BL6}$/ ).

10. The semiconductor memory device according to claim 9, wherein said plurality of devices as cross-coupled comprises cross-coupled two N channel MOS transistors (Q19, Q21), and cross-coupled two P channel MOS transistors (Q20, Q22).

11. The semiconductor memory device according claim 2, wherein each of said plurality of sub-input/output lines (SIO1, $\overline{SIO1}$/ ; SIO2, $\overline{SIO2}$/ ) is divided into a first portion connected to the corresponding first switching means (S1~S6) and a second portion provided with the corresponding holding means (60), and which further comprises a plurality of third switching means (Q11, Q12) provided corresponding to said plurality of sub-input/output lines (SIO1, $\overline{SIO1}$/ ; SIO2, $\overline{SIO2}$/ ) and each connected between the corresponding first portion and the corresponding second portion.

12. The semiconductor memory device according to claim 11, which further comprises a plurality of fourth switching means (Q23, Q24) each connected between each of said plurality of holding means (60) and the corresponding sub-input/output line (SIO1, $\overline{SIO1}$/ ; SIO2, $\overline{SIO2}$/ ), said plurality of holding means (60) being operable independent of an access operation to said memory cells.

13. The semiconductor memory device according to claim 2, which further comprises a plurality of fourth switching means (Q23, Q24) each connected between each of said plurality of holding means (60) and the corresponding sub-input/output line (SIO1, $\overline{SIO1}$/ ; SIO2, $\overline{SIO2}$/ ), said plurality of holding means (60) being operable independent of an access operation to said memory cells.

14. The semiconductor memory device according to claim 2, having a first operation mode in which each of said plurality of holding means (60) serves as an amplifier for amplifying the information on the corresponding sub-input/output line (SIO1, $\overline{SIO1}$/ ; SIO2, $\overline{SIO2}$/ ), and a second operation mode in which each of said plurality of holding means (60) serves as a latch circuit for holding information, and each of said plurality of comparing means (50) compares information read out from a selected memory cell (MC1, MC2) to the corresponding sub-input/output line (SIO1, $\overline{SIO1}$/ ; SIO2, $\overline{SIO2}$/ ) through the corresponding bit line (B1, $\overline{B1}$/ ~BL6, $\overline{BL6}$/ ) with the information held in the corresponding holding means (60).

15. The semiconductor memory device according to claim 2, which further comprises a redundant circuit (la), and redundant circuit activating means comprising a link element (Fl, F2) and responsive to the presence or absence of disconnection of the link element (Fl, F2) for activating said redundant circuit (la).

16. A method for operating a semiconductor memory device having on-chip test circuit, comprising a plurality of groups of bit lines (BL1, $\overline{BL1}$/ ~BL3, $\overline{BL3}$/ ; BL4, $\overline{BL4}$/ ~BL6, $\overline{BL6}$/ each comprising a plurality of bit lines; a plurality of word lines (WL) arranged intersecting with said plurality of bit lines (BL1, $\overline{BL1}$/ ~BL6, $\overline{BL6}$/ ); a plurality of memory cells (MC1, MC2), respectively provided at intersections of said plurality of bit lines (BL1, $\overline{BL1}$/ ~BL6, $\overline{BL6}$/ ) and said plurality of word line (WL) for storing information; a plurality of sub-input/output lines (SIO1, $\overline{SIO1}$/ ; SIO2, $\overline{SIO2}$/ ) each provided corresponding to each of said plurality of groups of bit lines; an input/output line (I/O, $\overline{I/O}$/ ) common to said plurality of sub-input/output lines (SIO1, $\overline{SIO1}$/ ; SIO2, $\overline{SIO2}$/ ); a plurality of holding means (60) each provided corresponding to each of said plurality of sub-input/output lines (SIO1, $\overline{SIO1}$/ ; SIO2, $\overline{SIO2}$/ ); and a plurality of comparing means (50) each provided corresponding to each of said plurality of sub-input/output lines (SIO1, $\overline{SIO1}$/ ; SIO2, $\overline{SIO2}$/ ), comprising the steps of:

writing the information applied to said input/output line (I/O, $\overline{I/O}$/ ) into the selected memory cell through the corresponding sub-input/output line and the corresponding bit line, each of said plurality of holding means (60) serving as an amplifier for amplifying information on the corresponding sub-input/output line, reading out information stored in a selected memory cell onto said input/output line (I/O, $\overline{I/O}$/ ) through the corresponding bit line and the corresponding sub-input/output line, each of said plurality of holding means (60) serving as an amplifier for amplifying information on the corresponding sub-input/output line, writing information into said plurality of holding means (60) through said input/output line (I/O, $\overline{I/O}$/ ) and said plurality of sub-input/output line (SIO1, $\overline{SIO1}$/ ; SIO2, $\overline{SIO2}$/ ), each of said plurality of holding means (60) serving as a latch circuit for latching information, and comparing information respectively read out onto the plurality of sub-input/output lines (SIO1, $\overline{SIO1}$/ ; SIO2, $\overline{SIO2}$/ ) from the plurality of memory cells (MC1, $\overline{MC2}$/ ) corresponding to a selected one word line (WL) through the corresponding bit line with the information held in said plurality of holding means (60) by said plurality of comparing means (50) during testing.

17. A testing method in a semiconductor memory device comprising a plurality of groups of bit lines (BL1, $\overline{BL1}$/ ~BL3, $\overline{BL3}$/ ; BL4, $\overline{BL4}$/ ~BL6, b1/ ) each comprising a plurality of bit lines; a plurality of word lines (WL) arranged intersecting with said plurality of bit lines (BL1, $\overline{BL1}$/ ~BL6, $\overline{BL6}$/ ); a plurality of memory cells (MC1, MC2), respectively provided at intersections of said plurality of bit lines (BL1, $\overline{BL1}$/ ~BL6, $\overline{BL6}$/ ) and said plurality of word line (WL), for storing information; a plurality of sub-input/output lines (SIO1, $\overline{SI1}$/ ; SIO2, $\overline{SIO2}$/ ) each provided corresponding to each of said plurality of groups of bit lines; an input/output line (I/O, $\overline{I/O}$/ ) common to said plurality of sub-input/output lines (SIO1, $\overline{SIO1}$/ ; SIO2, $\overline{SIO2}$/ ); a plurality of holding means (60) each provided corresponding to each of said plurality of sub-input/output lines (SIO1, $\overline{SIO1}$/ ; SIO2, $\overline{SIO2}$/ ); and a plurality of comparing means (50) each provided corresponding to each of said plurality of sub-input/output lines (SIO1, $\overline{SIO1}$/ ; SIO2. $\overline{SIO2}$/ ), comprising the steps of:

writing random information into said plurality of holding means (60) through said input/output line (I/O, $\overline{I/O}$/ ) and said plurality of sub-input/output lines (SIO1, $\overline{SIO1}$/ ; SIO2, $\overline{SIO2}$/ ), writing said information held in said plurality of holding means (60) into a plurality of memory cells (MC1, MC2) corresponding to a selected word line (WL) through said plurality of sub-input/output lines (SIO1, $\overline{SIO1}$/ ; SIO2, $\overline{SIO2}$/ ) and corresponding bit lines, and comparing information read out onto said plurality of sub-input/output lines (SIO1, $\overline{SIO1}$/ ; SIO2, $\overline{SIO2}$/ ) from the plurality of memory cells (MC1, MC2) corresponding to the selected word line (WL) through the corresponding bit lines with the information held in said plurality of holding means (60) by said plurality of comparing means (50).

18. A semiconductor memory device having hierarchical data bus lines including a plurality of hierarchies, comprising:

a plurality of holding means (60) provided for data bus lines included in any one of said plurality of hierarchies and each having an amplifying function of amplifying information on the corresponding data bus line and a latching function of holding the information, and a plurality of comparing means (50) provided corresponding to said plurality of holding means (60) for each comparing the information on the corresponding data bus line with the information held in the corresponding holding means (60).

* * * * *